(12) United States Patent
Iwamoto et al.

(10) Patent No.: US 9,508,641 B2
(45) Date of Patent: Nov. 29, 2016

(54) SEMICONDUCTOR DEVICE AND A METHOD INCREASING A RESISTANCE VALUE OF AN ELECTRIC FUSE

(71) Applicant: Renesas Electronics Corporation, Kawasaki (JP)

(72) Inventors: Takeshi Iwamoto, Tokyo (JP); Kazushi Kono, Tokyo (JP); Masashi Arakawa, Tokyo (JP); Toshiaki Yonezu, Tokyo (JP); Shigeki Obayashi, Tokyo (JP)

(73) Assignee: Renesas Electronics Corporation, Kawasaki (JP)

( * ) Notice: Subject to any disclaimer, the term of this patent is extended or adjusted under 35 U.S.C. 154(b) by 0 days.

(21) Appl. No.: 14/590,294

(22) Filed: Jan. 6, 2015

(65) Prior Publication Data

US 2015/0303144 A1 Oct. 22, 2015

Related U.S. Application Data

(63) Continuation of application No. 14/033,036, filed on Sep. 20, 2013, now abandoned, which is a continuation of application No. 12/760,648, filed on Apr. 15, 2010, now abandoned, which is a continuation of application No. 11/683,053, filed on Mar. 7, 2007, now Pat. No. 7,745,905.

(30) Foreign Application Priority Data

Mar. 7, 2006 (JP) .................................. 2006-061512
Sep. 21, 2006 (JP) .................................. 2006-256226

(51) Int. Cl.
*H01L 23/525* (2006.01)
*H01L 23/528* (2006.01)
(Continued)

(52) U.S. Cl.
CPC ....... *H01L 23/5256* (2013.01); *H01L 23/5283* (2013.01); *H01L 23/53228* (2013.01);
(Continued)

(58) Field of Classification Search
CPC .................... H01L 23/5256; H01L 23/53228; H01L 23/5283; H01L 23/62; H01L 27/11206; H01L 23/5227; H01L 21/76828
USPC ................ 257/209, 528–530, 750, 752, 759, 257/E29.159
See application file for complete search history.

(56) References Cited

U.S. PATENT DOCUMENTS 2,373,117 A 4/1945 Hobrock
3,565,602 A 2/1971 Konisi et al.
(Continued)

FOREIGN PATENT DOCUMENTS

JP 2001-68555 3/2001
JP 2002-313910 10/2002
(Continued)

OTHER PUBLICATIONS

Office Action in JP 2014-001655, dispatch date Jan. 13, 2015 (in Japanese, 2 pgs.), [English language translation (3 pgs)].
(Continued)

*Primary Examiner* — Galina Yushina
(74) *Attorney, Agent, or Firm* — Gregory E. Montone; Roberts Mlotkowski Safran, Cole & Calderon, P.C.

(57) ABSTRACT

A semiconductor device having an electric fuse structure which receives an electric current to permit the electric fuse to be cut without damaging portions around the fuse. The electric fuse can be electrically connected between an electronic circuit and a redundant circuit as a spare of the electronic circuit. After these circuits are sealed with a resin, the fuse can be cut by receiving the electric current from the outside. The electric fuse is formed in a fine layer, and is made of a main wiring and a barrier film. The linear expansion coefficient of each of the main wiring and the barrier film is larger than that of each of the insulator layers. The melting point of each of the main wiring and the barrier film is lower than that of each of the insulator layers.

9 Claims, 33 Drawing Sheets

(51) Int. Cl.
*H01L 23/532* (2006.01)
*H01L 23/522* (2006.01)
*H01L 23/62* (2006.01)

(52) U.S. Cl.
CPC .......... *H01L23/525* (2013.01); *H01L 23/5227* (2013.01); *H01L 23/62* (2013.01); *H01L 2924/0002* (2013.01)

(56) References Cited

U.S. PATENT DOCUMENTS

| | | | |
|---|---|---|---|
| 5,757,264 | A | 5/1998 | Petit |
| 5,969,404 | A | 10/1999 | Bohr et al. |
| 6,162,686 | A | 12/2000 | Huang et al. |
| 6,256,239 | B1 | 7/2001 | Akita et al. |
| 6,258,700 | B1 | 7/2001 | Bohr et al. |
| 6,288,436 | B1 | 9/2001 | Narayan et al. |
| 6,362,514 | B1 | 3/2002 | Ido et al. |
| 6,433,404 | B1 | 8/2002 | Iyer et al. |
| 6,492,734 | B2 | 12/2002 | Watanabe |
| 6,727,590 | B2 | 4/2004 | Izumitani et al. |
| 6,822,310 | B2 | 11/2004 | Kono et al. |
| 6,972,491 | B2 | 12/2005 | Yamada et al. |
| 7,250,679 | B2 | 7/2007 | Otsuka |
| 7,254,078 | B1* | 8/2007 | Park et al. ................. 365/225.7 |
| 7,282,751 | B2 | 10/2007 | Ueda |
| 7,321,171 | B2 | 1/2008 | Saito et al. |
| 7,619,264 | B2 | 11/2009 | Ueda |
| 7,759,768 | B2 | 7/2010 | Barth et al. |
| 7,795,699 | B2 | 9/2010 | Ueda |
| 2002/0074616 | A1 | 6/2002 | Chen et al. |
| 2002/0185974 | A1 | 12/2002 | Nakano et al. |
| 2003/0080428 | A1* | 5/2003 | Izumitani et al. ............ 257/758 |
| 2004/0007777 | A1* | 1/2004 | Kono et al. ................... 257/758 |
| 2004/0053487 | A1 | 3/2004 | Jeng et al. |
| 2004/0085405 | A1 | 5/2004 | Baek |
| 2004/0140569 | A1* | 7/2004 | Meguro ................ H01L 27/105 257/776 |
| 2004/0224444 | A1 | 11/2004 | Hisaka |
| 2005/0121791 | A1* | 6/2005 | Yamada et al. ............... 257/758 |
| 2005/0143950 | A1 | 6/2005 | Kawamura |
| 2005/0179062 | A1 | 8/2005 | Kajita |
| 2006/0055046 | A1 | 3/2006 | Kanamura |
| 2006/0057783 | A1* | 3/2006 | Yun .................... H01L 23/5258 438/128 |
| 2006/0104006 | A1 | 5/2006 | Saito et al. |
| 2006/0244144 | A1 | 11/2006 | Yamada et al. |
| 2006/0289899 | A1* | 12/2006 | Yoon ................... H01L 23/5258 257/209 |
| 2007/0052063 | A1 | 3/2007 | Ueda |
| 2007/0063313 | A1 | 3/2007 | Barth et al. |
| 2010/0117190 | A1 | 5/2010 | Chuang et al. |

FOREIGN PATENT DOCUMENTS

| | | |
|---|---|---|
| JP | 2005039220 | 2/2005 |
| JP | 2005-57186 | 3/2005 |
| JP | 2005136301 | 5/2005 |
| JP | 2005-167160 | 6/2005 |
| JP | 2007-73624 | 3/2007 |
| WO | WO 97/12401 | 4/1997 |

OTHER PUBLICATIONS

Office Action in JP 2014-001655, dispatch date Oct. 7, 2014 (in Japanese, 2 pgs.), [English language translation (4 pgs)].

V. Klee et al., "A 0.13 n m logic based embedded DRAM technology with electrical fuses, Cu interconnect in SiLk™, sub-7ns random access time and its extension to the 0.10 μ m generation", IEDM Conference (2001).

Office Action in Taiwanese Patent Appln. Ser. No. 095146735, dated Apr. 10, 2013 (4 pgs.), English language translation [6 pgs.].

Kim et al., Characterization of low-dielectric constant SiOC thin films deposited by PECVD for interlayer dielectrics of multilevel interconnection. Surface and Coating Technology 171 (2003), pp. 39-45.

Rouxel et al., High Temperature Behavior of a Gel-Derived SiOC Glass: Elasticity and Viscosity. Journal of sol-Gel Science and Technology 14, (1999), pp. 87-94.

Burns et al., High-Temperature Chemistry of the Conversion of Silixanes Carbide. chem.. Materi., 1992, 4 pgs. 1313-1323.

Office Action in Japanese Patent Appln. No. 2006-256226 on Dec. 20, 2011.

Japanese Office Action dated Apr. 19, 2016 in related Application No. 2015081702, 4 pages.

JP Office Action dispatch date Sep. 13, 2016 in related JP Application No. 2014-001655, 57 pages.

* cited by examiner

STRAIGHT TYPE

○ PORTION WHERE STRESS IS MOST GREATLY CONCENTRATED
→ COMPRESSIVE STRESS
--→ TENSILE STRESS

LOW ▭▦ HIGH
DENSITY

LOW ▭▦ HIGH
DENSITY

→ : FLOW OF LIQUID

LOW ▭▬ HIGH
    DENSITY

LOW ▭▬ HIGH
    DENSITY

LOW ▭▬ HIGH
DENSITY

SEMICONDUCTOR DEVICE AND A METHOD INCREASING A RESISTANCE VALUE OF AN ELECTRIC FUSE

CROSS-REFERENCE TO RELATED APPLICATION

This application is a continuation of U.S. application Ser. No. 14/033,036, filed Sep. 20, 2013; which, in turn, is a continuation of U.S. application Ser. No. 12/760,648, filed Apr. 15, 2010 (now abandoned), which, in turn, is a continuation of U.S. application Ser. No. 11/683,053, filed Mar. 7, 2007 (now U.S. Pat. No. 7,745,905); and which application claims priority from Japanese patent applications No. 2006-256226 filed on Sep. 21, 2006 and No. 2006-061512, filed on Mar. 7, 2006, the entire contents of which are hereby incorporated by reference into this application.

BACKGROUND OF THE INVENTION

The present invention relates to a semiconductor device which receives the supply of an electric current so as to be permitted to increase the resistance of the device itself, and a method of increasing the resistance of an electric fuse.

Hitherto, there has been used a fuse which receives the supply of an electric current to be permitted to increase the resistance of the fuse itself. In the present specification, such a fuse is called an electric fuse. The electric fuse is set inside an insulator layer. In the specification, a structure having an insulator layer and an electric fuse is called an electric fuse structure. In the specification, an increase in the resistance of an electric fuse is, for example, a phenomenon that the value of an electric current flowing into the electric fuse becomes small, that is, the electric fuse turns into a state that the fuse has a higher resistance than before, or a phenomenon that the flow of an electric current between two elements connected to both ends of the electric fuse stops completely, that is, the electric fuse is cut or melted/cut, or the resistance of the electric fuse becomes infinite. Examples of the electric fuse described in the specification include a fuse for making the use of an electric circuit impossible, a fuse which is used in an analog device or the like to adjust the voltage of the device, and a fuse which is used as a tag for leaving the hysteresis of a process, a test result or the like.

[Patent Document 1] Pamphlet of WO 97/12401
[Patent Document 2] U.S. Pat. No. 5,969,404
[Patent Document 3] U.S. Pat. No. 6,323,535
[Patent Document 4] U.S. Pat. No. 6,433,404
[Patent Non-document 1] V. Klee et al., "A 0.13 µm logic based embedded DRAM technology with electrical fuses, Cu interconnect in SiLk™, sub-7 ns access and its extension to the 0.10 µm generation", IEDM Conference (2001).

SUMMARY OF THE INVENTION

Increases in the resistance of conventional electric fuses are realized by an electromigration phenomenon. For this reason, in some cases, it is necessary to supply a large electric current to an electric fuse. In such cases, a structure around the electric fuse may be damaged by heat generated from the fuse.

In light of the above-mentioned problems, the present invention has been made. Thus, an object of the invention is to provide a semiconductor device which is permitted to increase the resistance of the device itself without damaging any surrounding structure, and a method of increasing the resistance of an electric fuse.

An aspect of the present invention is a semiconductor device comprising an insulator layer and an electric fuse formed in the insulator layer. The electric fuse has a larger linear expansion coefficient than that of the insulator layer, and further has a lower melting point than that of the insulator layer.

According to this structure, the resistance of the electric fuse can be increased even if the value of an electric current supplied to the electric fuse is small. Accordingly, the amount of heat generated from the electric fuse is small. As a result, a structure around the electric fuse is prevented from being damaged.

Another aspect of the invention is a semiconductor device comprising a semiconductor substrate, a gate electrode formed over the semiconductor substrate, an interlayer dielectric covering the gate electrode, a fine layer formed over the interlayer dielectric, a semiglobal layer formed over the fine layer, a global layer formed over the semiglobal layer, and an electric fuse formed in at least one selected from the fine layer, the semiglobal layer, and the global layer.

According to this structure, when an electric current is supplied to the electric fuse, the distance over which heat generated from the electric fuse reaches the semiconductor substrate is large; therefore, the resistance of the electric fuse can be increased without damaging the semiconductor substrate.

Still another aspect of the invention is a semiconductor device comprising an insulator layer, and an electric fuse which is formed in the insulator layer, and has a meandering shape comprising a linear portion and a bent portion, wherein the distance between moieties near the bent portion is smaller than the distance between moieties other than the moieties near the bent portion.

According to this structure, heat from a central portion of the electric fuse does not diffuse outside easily since the electric fuse is meandering. Therefore, a structure around the electric fuse is restrained from being damaged by heat generated from the electric fuse. Moreover, a time required for an increase in the resistance of the electric fuse can be shortened since a large amount of heat is locally given only to the bent portion.

A different aspect of the invention is a method of increasing the resistance of an electric fuse wherein an electric current is supplied to the electric fuse which is any one of the above-mentioned electric fuses. In this way, the electric fuse is melted and is further cracked. Thereafter, a part of the melted electric fuse is absorbed into the crack by use of a capillary phenomenon. As a result, a discontinuous portion is formed in the electric fuse. According to this method, an electric fuse can be cut by a smaller electric current than that given to an electric fuse in any conventional method of using electromigration to cut the electric fuse.

A further different aspect of the invention is a method of increasing the resistance of an electric fuse comprising the steps of: supplying an electric current to the electric fuse which is any one of the above-mentioned electric fuses, thereby making the electric fuse narrow by use of pinch effect; and then stopping the supply of the electric current, thereby forming a cavity in the electric fuse by use of retaining force of the electric fuse. According to this method, an electric fuse can be cut by a smaller electric current than that given to an electric fuse in the above-mentioned method of cutting the electric fuse by use of a capillary phenomenon.

DETAILED DESCRIPTION OF THE PREFERRED EMBODIMENTS

With reference to the attached drawings, embodiments of the semiconductor device according to the present invention and the method of increasing the resistance of an electric fuse according to the invention will be described hereinafter.

Embodiment 1

An electric fuse of an embodiment 1 of the present invention is not any electric fuse formed in the same layer in which a gate electrode is formed, as in the prior art. The electric fuse of the embodiment 1 is formed in a fine layer in a multi-layered structure including the fine layer, a semiglobal layer and a global layer in a semiconductor device. Therefore, the electric fuse is prevented from damaging its semiconductor substrate.

According to the structure of the semiconductor device of the embodiment 1, other elements, such as a transistor for controlling the flow of an electric current for increasing the resistance of the fuse, can be arranged in a space from the semiconductor substrate to the electric fuse; therefore, it is possible to make small the occupation area of elements arranged in a direction parallel to a main surface of the semiconductor substrate of the semiconductor device.

The increase in the resistance of the electric fuse of the embodiment 1 is realized not by any electromigration phenomenon but a capillary phenomenon. Accordingly, the resistance of the electric fuse can be increased only by causing a relatively small electric current to flow into the electric fuse. As a result, a structure around the electric fuse is prevented from being damaged. Moreover, the time necessary for an increase in the resistance of the electric fuse can be largely shortened.

In the embodiment 1, the electric fuse is a member for separating a redundant circuit and any other circuit electrically from each other. However, the usage of the electric fuse of the invention is not limited thereto. The electric fuse of the invention can be applied to any article as long as the article is an article having a resistance that can be increased by receiving the supply of an electric current. The raw material of the electric fuse is suitably a metal or a metal compound. However, the raw material of the electric fuse of the invention is not limited thereto as long as a resistance-increasing method that will be described below can be applied to the raw material.

Figure 1:
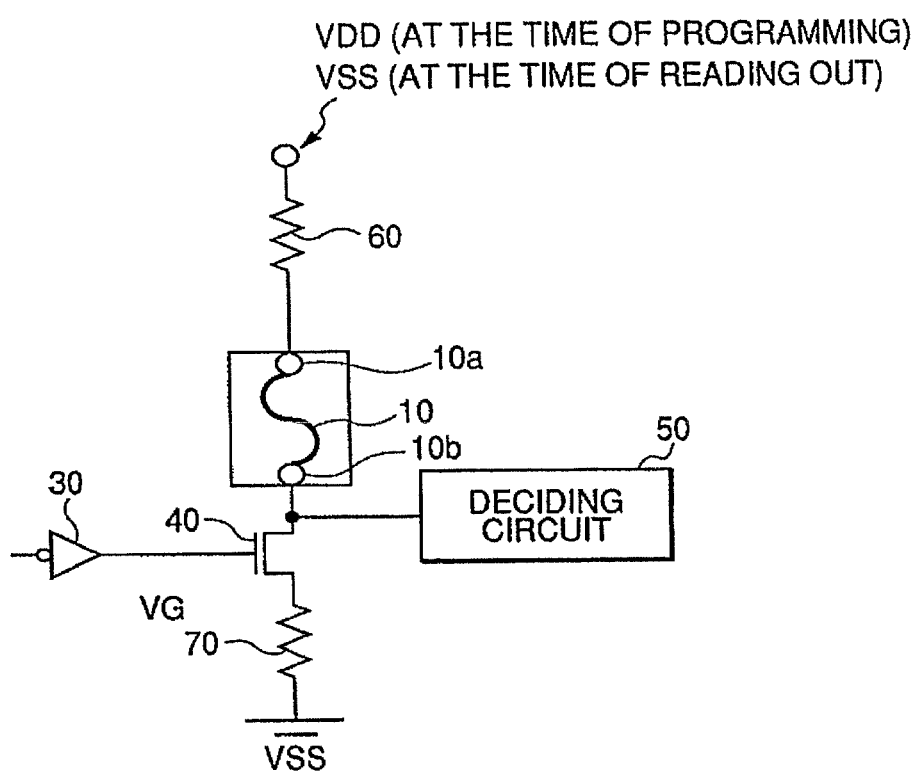
FIG. 1 is a schematic view illustrating a structure of an electronic circuit to which an electric fuse of an embodiment of the invention is fitted.

First, the electric fuse structure of the embodiment 1 is specifically described herein. As illustrated in FIG. 1, the electric fuse (electric fuse 10) of the embodiment 1 is set inside a semiconductor device, and is connected to a power source electrode VDD and an earth electrode VSS so as to be present therebetween. A resistor 60 is arranged between a terminal 10*a* of the electric fuse 10 and the power source electrode VDD, and a resistor 70 is arranged between a terminal 10*b* of the electric fuse 10 and the earth electrode VSS. A transistor 40 and a decision circuit 50 are connected to a wiring between the resistor 70 and the terminal 10*b*. The decision circuit 50 is a circuit for detecting whether or not the resistance of the electric fuse 10 turns into a predetermined value or more. An inverter circuit 30 is connected to the gate electrode of the transistor 40. In accordance with an electric signal given from the inverter circuit 30 to the transistor 40, an electric current flows from the power source electrode VDD through the electric fuse 10 to the earth electrode VSS. Accordingly, in the method of increasing the resistance of the electric fuse 10 in the embodiment 1, whether or not the resistance of the electric fuse is increased can be controlled in accordance with an electric signal given to the transistor 40 from the outside. Whether or not the resistance of the electric fuse 10 is over the predetermined value is decided by the decision circuit 50.

Figure 2:
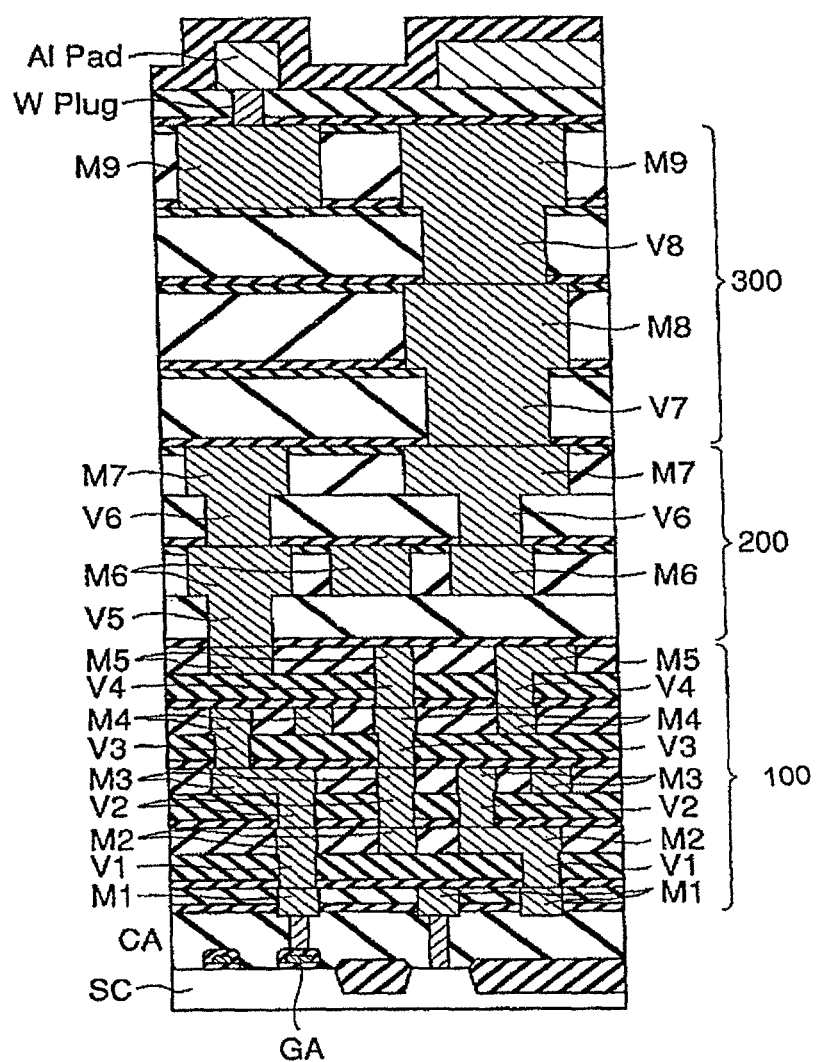
FIG. 2 is a view illustrating a structure of the whole of a semiconductor device wherein an electric fuse structure of the embodiment is formed.

Next, the structure of the semiconductor of the embodiment 1 is described herein with reference to FIG. 2. The semiconductor device of the embodiment 1 has plural stacked metal wiring layers. The metal wiring layers are named M1, M2, . . . M8 and M9, respectively, in the order from the side of a semiconductor substrate SC upwards. The metal wiring layers are connected to each other through vias. The vias are named V1, V2, . . . , V7 and V8, respectively, in the order from the side of the semiconductor substrate SC upwards.

Out of the layers including the metal wiring layers M1, M2, . . . M8 and M9, and the vias V1, V2, . . . , V7 and V8, layers positioned at a lower side are called a fine layer 100, and layers positioned at an upper side are called a global layer 300. The layers positioned between the fine layer 100 and the global layer 300 are called a semiglobal layer 200.

The metal wiring layers in the fine layer 100 each have the smallest wiring width and thickness among the metal wiring layers constituting the semiconductor device. The metal wiring layers in the semiglobal layer 200 each have a larger wiring width and a larger thickness than those of the metal wiring layers in the fine layer 100. The metal wiring layers in the global layer 300 each have a larger wiring width and a larger thickness than those of the metal wiring layers in the semiglobal layer 200. Examples of dimensions of the fine layer 100, the semiglobal layer 200 and the global layer 300 are shown in Table 1.

TABLE 1

|  | Wiring width(μm) | Wiring thickness(nm) |
| --- | --- | --- |
| Fine layer | 0.12 | 200 |
| Semiglobal layer | 0.3 | 400 |
| Global layer | 0.6 | 1000 |

The dimensions of the fine layer 100, the semiglobal layer 200 and the global layer 300 are varied in accordance with the kind of the semiconductor device, and the material of the wirings. Accordingly, Table 1 shows a mere example of a relationship between the dimensions of the three layers.

In a conventional semiconductor device, a wiring layer equivalent to a gate electrode layer GA covered with an interlayer dielectric (TEOS: tetraethyl ortho silicate glass) CA shown in FIG. 2 is partially used as an electric fuse. For this reason, when a large electric current is supplied to the electric fuse so as to make the resistance of a predetermined portion of the electric fuse high, a semiconductor substrate of the conventional device and a surrounding portion thereof may be damaged by heat generated from the electric fuse. Against this matter, in the embodiment 1, the electric fuse 10 is arranged near the metal wiring layers M1 to M5 in the fine layer 100.

The metal wiring layers M1 to M5, which constitute the fine layer 100, are formed in accordance with a single rule for plural layers (generally, the number of the layers is from about 4 to 6), this matter being different from rules for the metal wiring layers M6 and M7, which constitute the semiglobal layer 200, and for the metal wiring layers M8 and M9, which constitute the global layer 300. Therefore, the electric fuse 10 can be formed in any one of the layers in fine layer 100. For example, the electric fuse 10 can be formed near the metal wiring layer M5, which is formed at a position farthest from the semiconductor substrate SC.

Accordingly, when an electric current is supplied to the electric fuse 10, heat generated from the electric fuse 10 is prevented from producing an adverse effect onto the semiconductor substrate SC. Even if the electric fuse 10 is formed in the semiglobal layer 200 or the global layer 300, the electric fuse 10 can be prevented from producing an adverse effect onto the semiconductor substrate SC. In other words, even if the electric fuse 10 is formed in any one of the layers in the fine layer 100, the semiglobal layer 200 and the global layer 300, or the electric fuse 10 and one or more electric fuses equivalent thereto are formed in any two or all of these layers, the electric fuse 10 can be prevented from producing an adverse effect onto the semiconductor substrate SC.

In the semiconductor device of the embodiment 1, the metal wiring layer which has a low resistance is used as the electric fuse 10. Thus, even if the value of the electric current supplied to the electric fuse 10 is small, the resistance of the electric fuse 10 can be increased.

Figure 3:
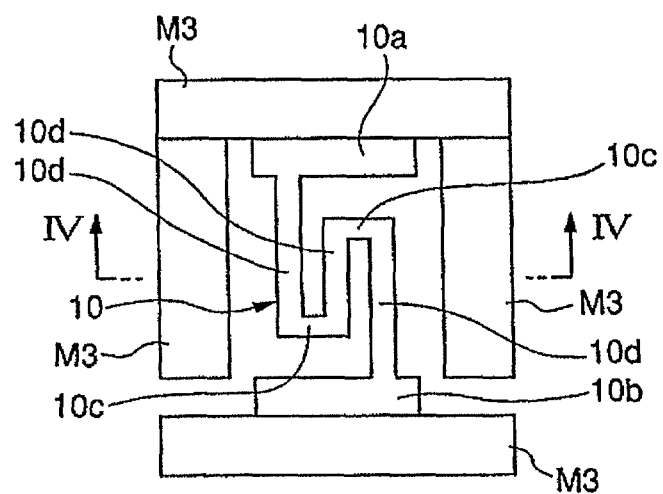
FIG. 3 is a schematic view illustrating the electric fuse of the embodiment which has a meandering shape.
Figure 4:
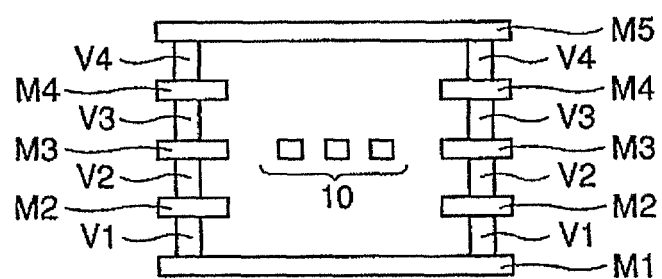
FIG. 4 is a sectional view taken on line IV-IV in FIG. 3.
Figure 5:
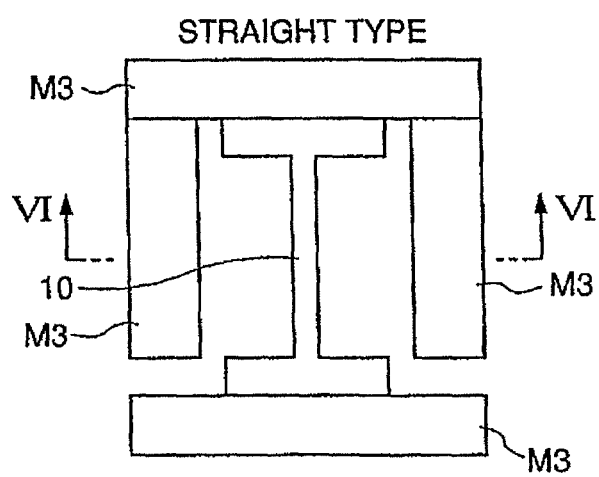
FIG. 5 is a schematic view illustrating the electric fuse of the embodiment which is made only of a liner portion.
Figure 6:
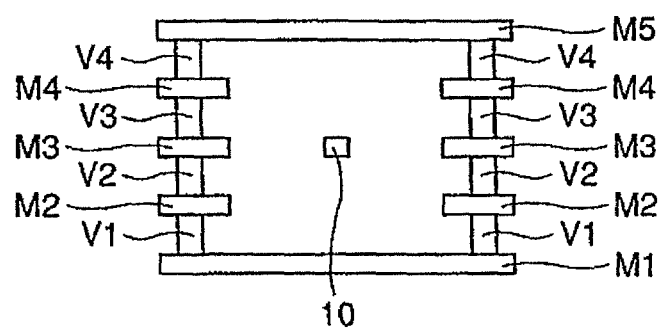
FIG. 6 is a sectional view taken on line VI-VI in FIG. 5.

FIGS. 3 and 4 are a top view and a sectional view of the electric fuse 10 of the embodiment 1 and a portion around the fuse 10, respectively. The electric fuse 10 of the embodiment 1 has a meandering shape composed of linear portions 10d and bent portions 10c. The electric fuse structure of the embodiment 1 may have an electric fuse 10 made only of a linear portion, as illustrated in FIGS. 5 and 6. However, when the electric fuse 10 having a meandering shape is compared with any electric fuse which is made only of a linear portion and has the same length as the meandering electric fuse 10, the meandering electric fuse 10 has an advantage that even if the value of an electric current supplied to the fuse 10 is small, the resistance of the fuse 10 can be made larger.

As illustrated in FIGS. 3 to 6, in the electric fuse structure of the embodiment 1, the electric fuse 10 is surrounded by the metal wiring layers M1 to M5 and the vias V1 to V4, which are each made of an electroconductive material. The metal wiring layers M1 to M5 and the vias V1 to V4 illustrated in FIGS. 3 to 6 are each an electrically-floating, electroconductive layer, which is electrically insulated from the other electroconductive layers. Accordingly, even if the electric fuse 10 melts out to leak into one or more of the insulator layers around the fuse 10, the metal wiring layers M1 to M5 and the vias V1 to V4 prevent the leaking fuse from producing an adverse effect onto any different electronic circuit.

Figure 7:
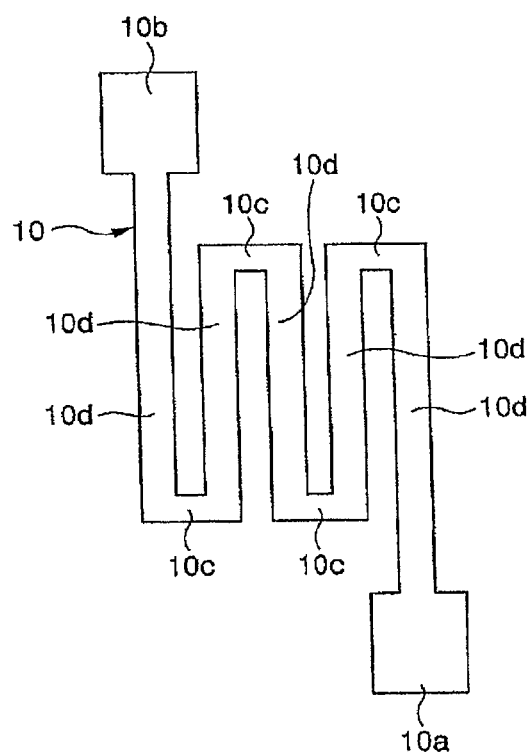
FIG. 7 is a schematic view illustrating another example of the electric fuse of the embodiment which has a meandering shape.

The electric fuse 10 of the embodiment 1 may have a structure as illustrated in FIG. 7. Specifically, the number of bent portions 10c and that of linear portions 10d are not each limited to any specific numerical value.

Figure 8:
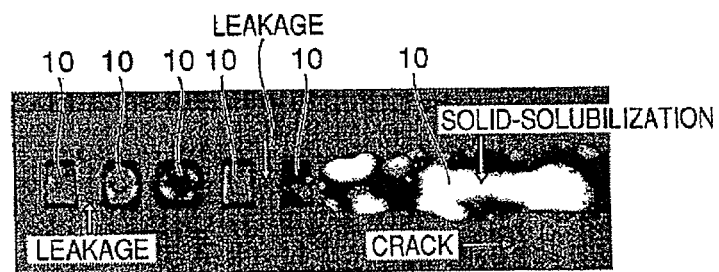
FIG. 8 is a photograph showing a state that linear portions of an electric fuse of the embodiment which has a meandering shape contact each other by leakage or solid dissolution.

FIG. 8 is a photograph showing a state that an example of the electric fuse 10 was actually cut. It can be understood from FIG. 8 that when the electric fuse 10, which is meandering, is cut, its portions adjacent to each other are brought into contact with each other to generate leakage and further a portion below the electric fuse 10 is cracked by an expansion in the volume of the portion converted to a solid solution. In other words, it can be understood that only an idea that the electric fuse 10 is meandered does not make it possible to increase the resistance of the electric fuse 10 while the electric fuse 10 is prevented from producing an adverse effect onto a structure around the fuse 10.

Figure 9:
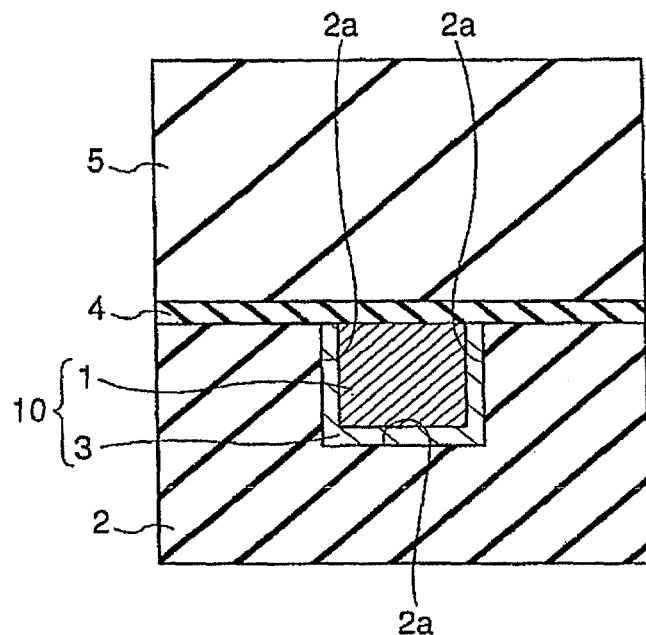
FIG. 9 is a view illustrating a basic example of the electric fuse structure of the embodiment.

Consequently, the electric fuse 10 of the embodiment 1 has a structure illustrated in FIG. 9 in order to increase the resistance of the electric fuse 10 while the electric fuse 10 is prevented from producing an adverse effect onto a structure around the fuse 10.

As illustrated in FIG. 9, the electric fuse 10 is made of a main wiring 1 and a barrier film 3 covering the lower face of the main wiring 1 and both side faces of the wiring 1. The electric fuse 10 extends inside a trench 2a made in the insulator layer 2 and in parallel to the main surface of the semiconductor substrate SC. The electric fuse 10 and the insulator layer 2 are covered with an insulator layer 4. An insulator layer 5 is formed on the insulator layer 4.

The main wiring 1 is made of a metal layer or a metal compound layer, and has a lower melting point than the insulator layer 2, the insulator layer 4 and the insulator layer 5 each have. The barrier film 3 is a metal layer or a metal compound layer, or has a structure wherein these layers are stacked. The melting point of the barrier film 3 is higher than that of the main wiring 1 and lower than those of the insulator layers 2 and 4. Furthermore, the linear expansion coefficient of the main wiring 1 is larger than that of the barrier film 3, and the linear expansion coefficient of the barrier film 3 is as large as or larger than that of each of the insulator layers 2, 4 and 5.

In the semiconductor device of the embodiment 1, the main wiring 1 is made of a copper film, and the barrier film 3 is a tantalum film. The insulator layers 2 and 5 are each a SiOC film, which is a low-k film having a dielectric constant of 3 or less, and the insulator layer 4 is a SiN film. However, the materials of the main wiring 1, the barrier film 3 and the insulator layers 2, 4 and 5 are not limited to the above-mentioned materials as long as the materials satisfy the above-mentioned relationships about the linear expansion coefficients and the melting points. For example, the insulator layer 4 may be a silicon nitride film (SiN film). The material of the main wiring 1 may be Al, Cu, Ta, Ti or W, as shown in Table 2.

TABLE 2

| | Linear expansion coefficient($10^{-6}$/K) | | | | Melting |
|---|---|---|---|---|---|
| | 300K | 600K | 800K | 1000K | point(° C.) |
| Al | 23.2 | 28.4 | 34 | — | 660.4 |
| Cu | 16.6 | 18.9 | 20.3 | 22.4 | 1084.5 |
| Ta | 6.3 | — | — | 7.3 | 2996 |
| Ti | 8.7 | 10.4 | 11.1 | 11.5 | 1675 |
| W | 4.5 | 4.7 | 5 | 5.2 | 3387 |
| Oxide films or nitride films used in the field of semiconductors | 0.5 to 10 | — | — | — | About 1000 to 1600 |

The electric fuse structure of the invention is not limited to the structure illustrated in FIG. 9, and may be a structure shown in each of FIGS. 10 to 20B. The structures shown in FIGS. 10 to 20B basically have a structure similar to the electric fuse structure illustrated in FIG. 9; therefore, the same reference number is attached to each of members or parts common to each other in these structures, and description thereof is not repeated. FIGS. 11A, 12A, 14A, 16A, 18A and 20A correspond to FIGS. 11B, 12B, 14B, 16B, 18B and 20B, respectively. Which of a structure illustrated in FIG. 11A and a structure illustrated in FIG. 11B is formed depends on a used production process. Consequently, in one device, there may be formed both of any one of the structures illustrated in FIGS. 11A, 12A, 14A, 16A, 18A and 20A and a structure corresponding thereto out of the structures illustrated in FIGS. 11B, 12B, 14B, 16B, 18B and 20B.

Figure 10:
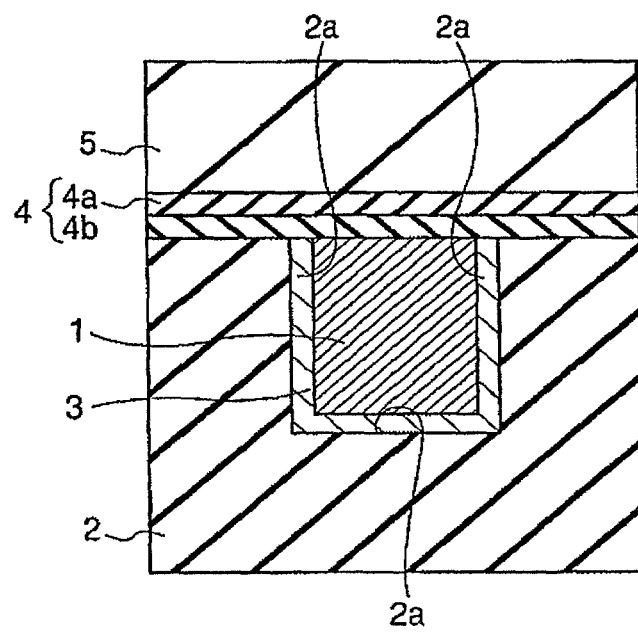
FIG. 10 is a first different example of the electric fuse structure of the embodiment.
Figure 11A:
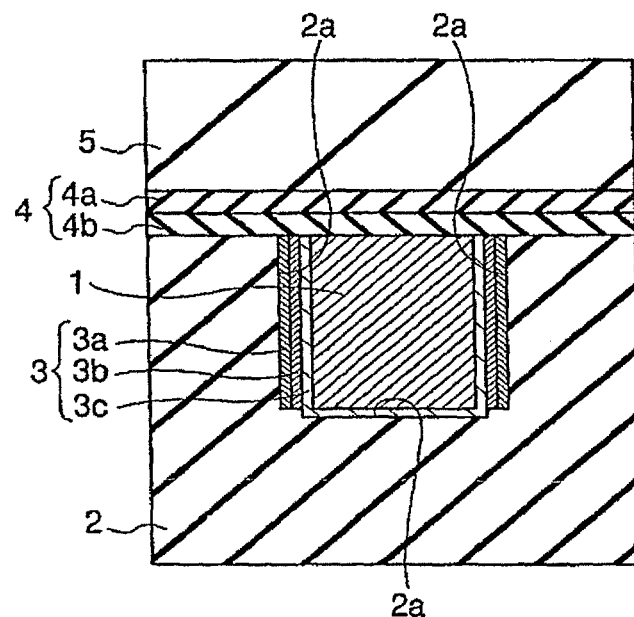
FIG. 11A is a second different example of the electric fuse structure of the embodiment.
Figure 11B:
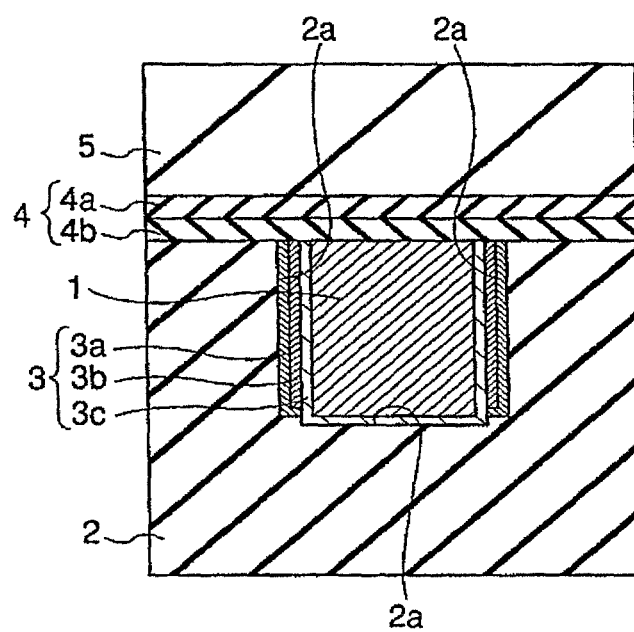
FIG. 11B is a third different example of the electric fuse structure of the embodiment.
Figure 12A:
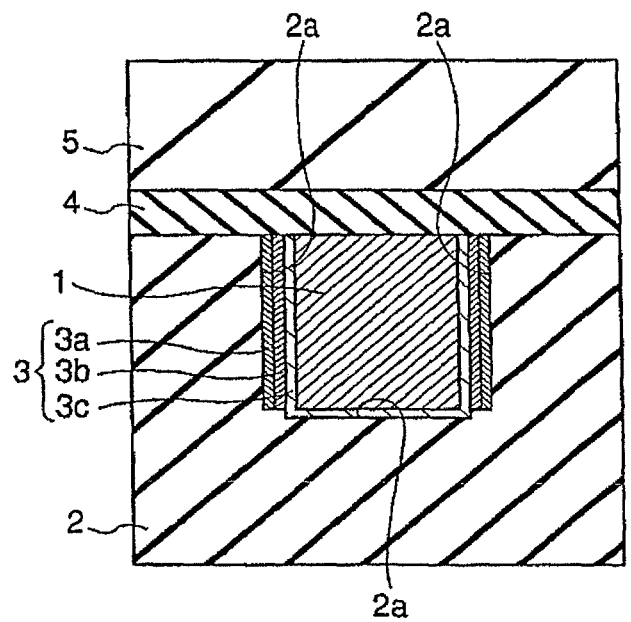
FIG. 12A is a fourth different example of the electric fuse structure of the embodiment.
Figure 12B:
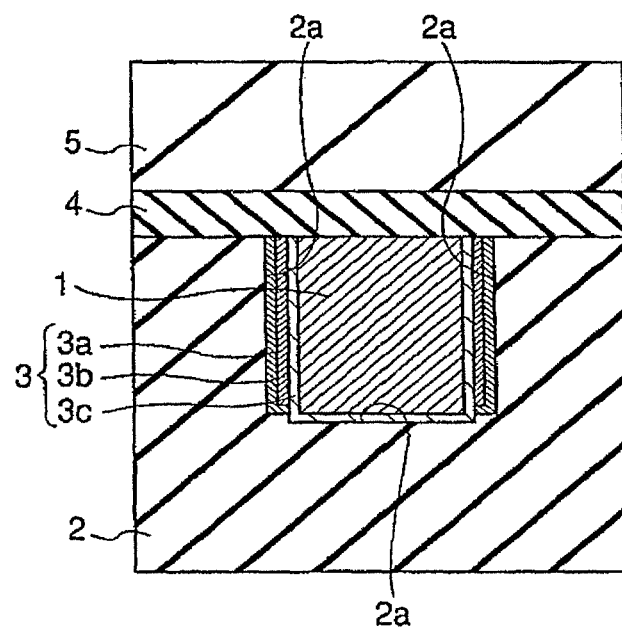
FIG. 12B is a fifth different example of the electric fuse structure of the embodiment.
Figure 13:
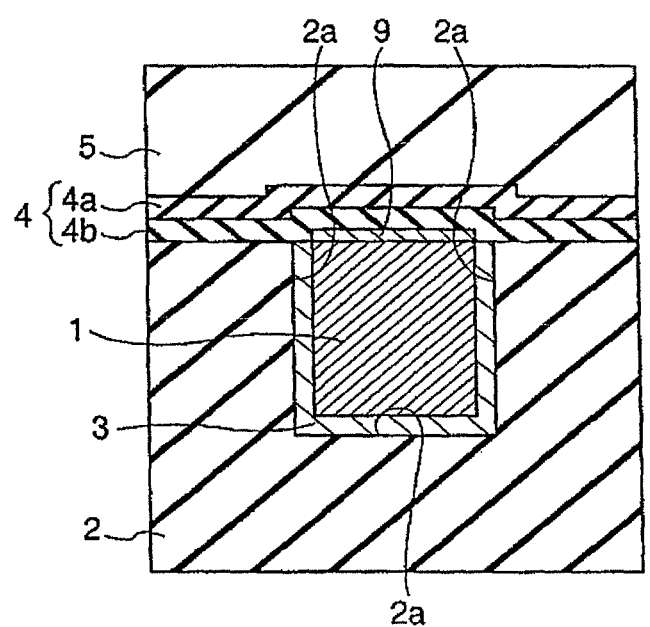
FIG. 13 is a sixth different example of the electric fuse structure of the embodiment.
Figure 14A:
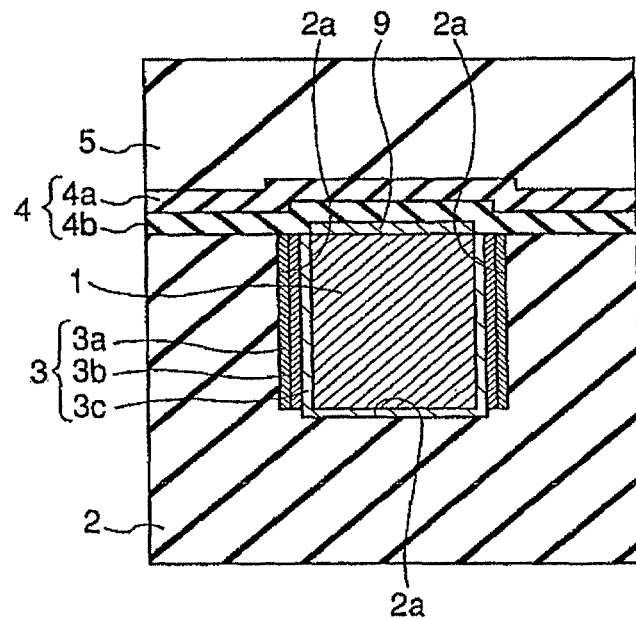
FIG. 14A is a seventh different example of the electric fuse structure of the embodiment.
Figure 14B:
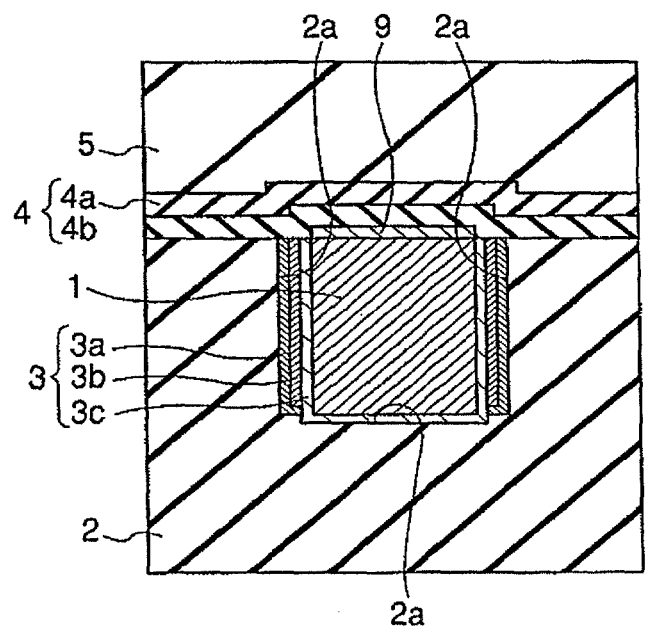
FIG. 14B is an eighth different example of the electric fuse structure of the embodiment.
Figure 15:
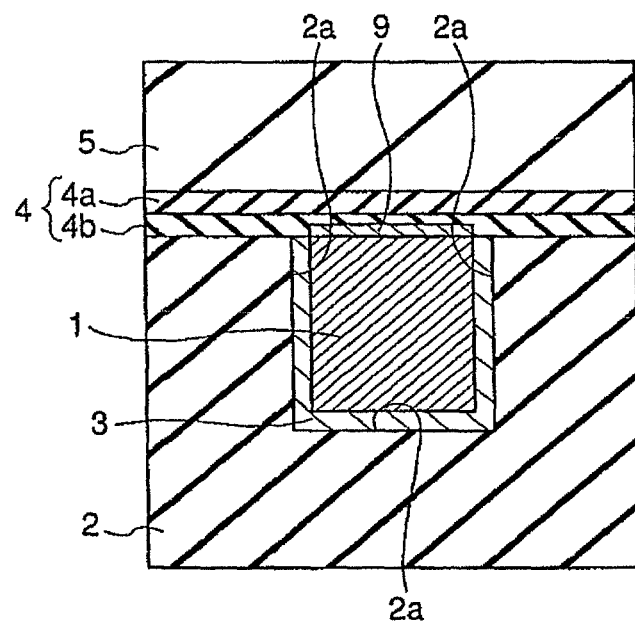
FIG. 15 is a ninth different example of the electric fuse structure of the embodiment.
Figure 16A:
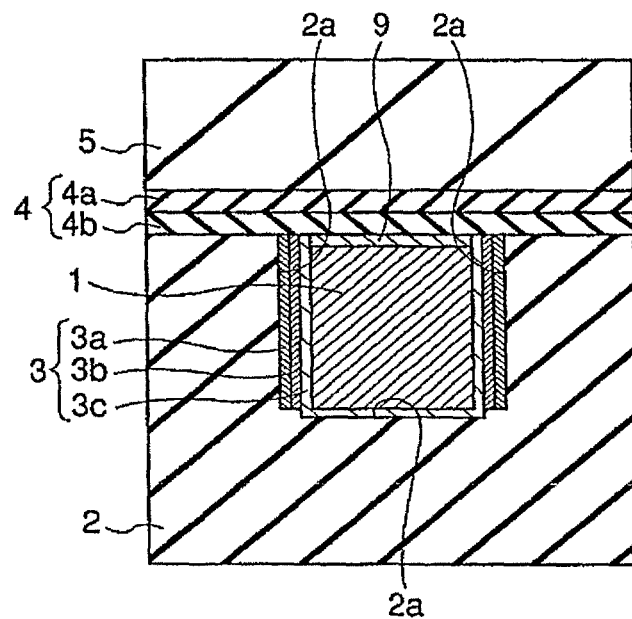
FIG. 16A is a tenth different example of the electric fuse structure of the embodiment.
Figure 16B:
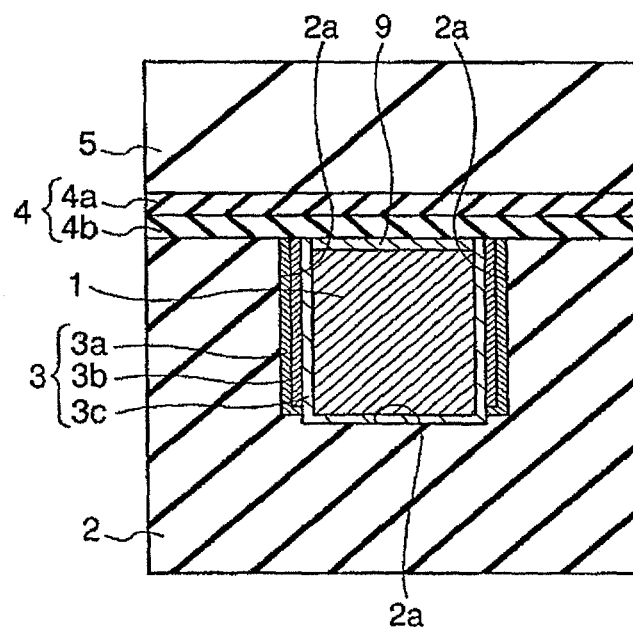
FIG. 16B is an eleventh different example of the electric fuse structure of the embodiment.
Figure 17:
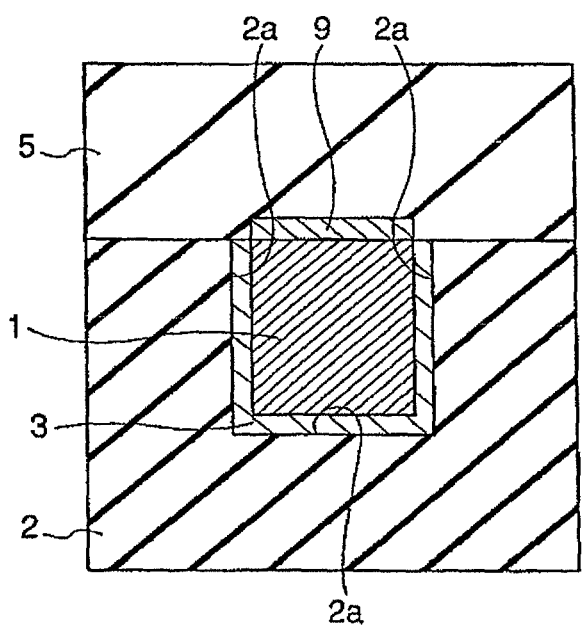
FIG. 17 is a twelfth different example of the electric fuse structure of the embodiment.
Figure 18A:
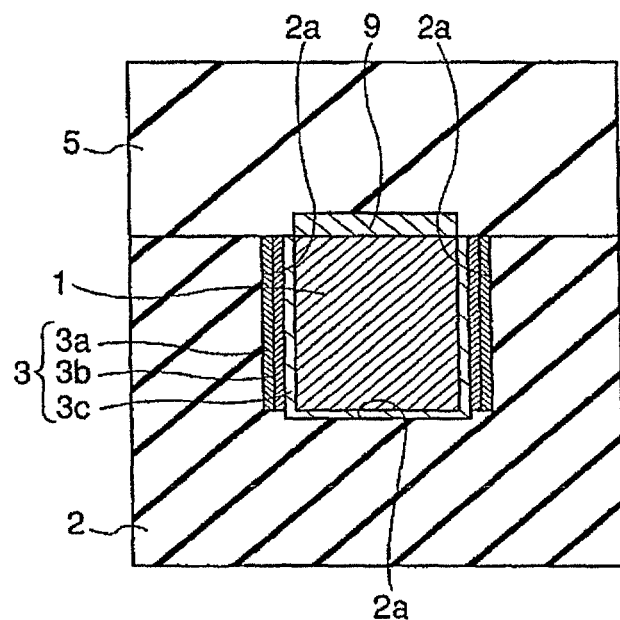
FIG. 18A is a thirteenth different example of the electric fuse structure of the embodiment.
Figure 18B:
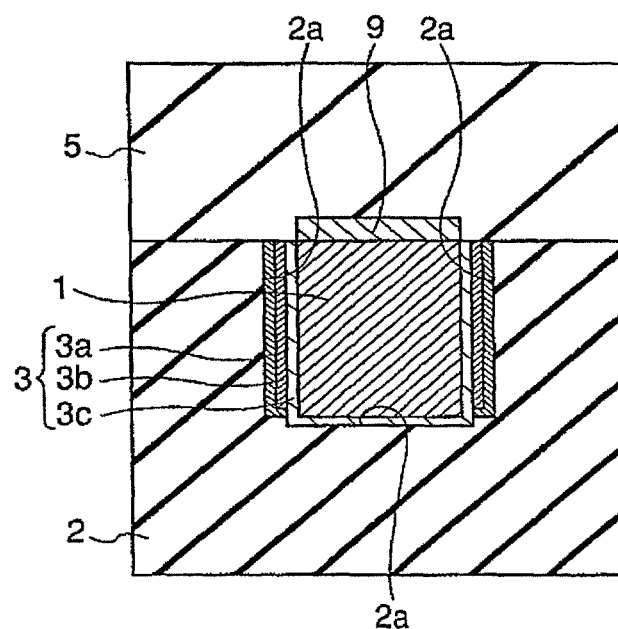
FIG. 18B is a fourteenth different example of the electric fuse structure of the embodiment.
Figure 19:
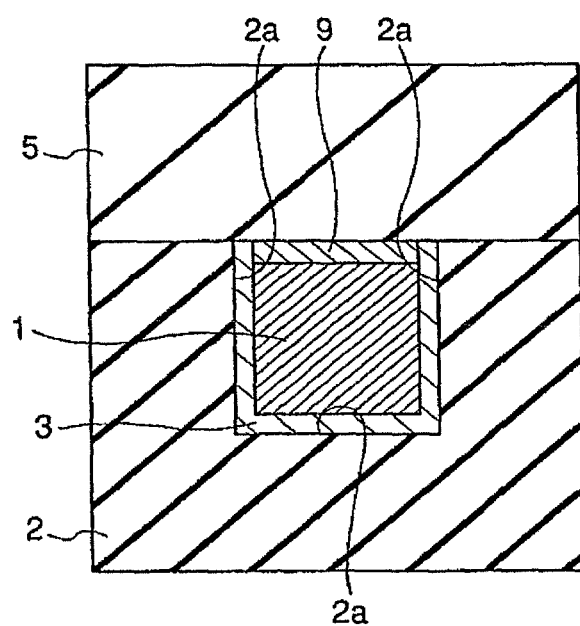
FIG. 19 is a fifteenth different example of the electric fuse structure of the embodiment.
Figure 20A:
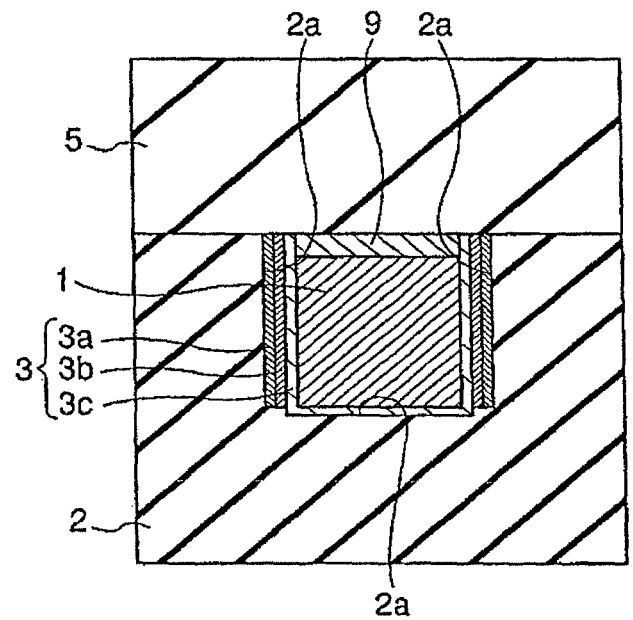
FIG. 20A is a sixteenth different example of the electric fuse structure of the embodiment.
Figure 20B:
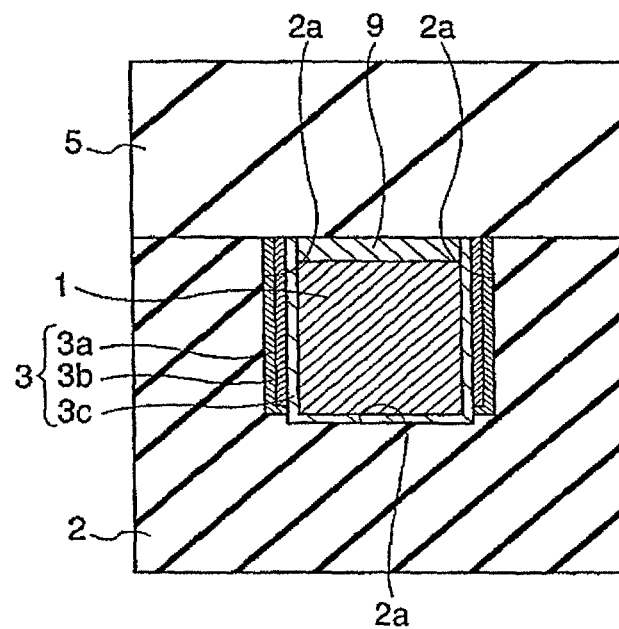
FIG. 20B is a seventeenth different example of the electric fuse structure of the embodiment.

In a structure illustrated in FIG. 10, an insulator layer 4 is composed of an insulator layer 4a and an insulator layer 4b. The insulator layer 4 is a SiCO layer, and the insulator layer 4b is a SiCN layer.

In each of the structures illustrated in FIGS. 11A, 11B, 12A and 12B, a barrier film 3 has a three-layer structure. The three-layer structure is composed of a Ta film 3a formed on side faces of a trench 2a, a TaN film 3b formed on inner side faces of the Ta film 3a, and a Ta film 3c formed on inner side faces of the TaN film 3b and the bottom face of the trench 2a.

In the structures illustrated in FIGS. 13 to 20B, a metal cap film 9 made of CoW, CoWP, CoP or CoPB is formed on a main wiring 1. The electric resistance of the metal cap film 9 is higher than that of the main wiring 1. Accordingly, when the metal cap film 9 is made on the main wiring 1, a larger heat is generated than heat generated from only the main wiring 1. In short, the resistance of the electric fuse 10 can be increased in a shorter time. The metal cap film 9 may be formed on the barrier film 3. The metal cap film 9 is formed on the entire upper face of the main wiring 1 so as to have a function of preventing the generation of electromigration of the main wiring 1. In the embodiment 1, the metal cap film 9 made of CoW, CoWP, CoP or CoPB is described as an example of the cap film. However, any film may be formed on the main wiring 1 as long as the film has a higher electric resistance than that of the main wiring 1.

In the structures illustrated in FIGS. 17 to 20B, the insulator layer 4 is not formed. In this case, a crack 6 is formed in an insulator layer 5.

The following will describe the effect generated when the resistance of the electric fuse of the embodiment 1 increases, in particular, the effect generated when the electric fuse is cut.

First, table 3 is used to describe, herein, the volume expansion coefficient of the metal which constitutes the main wiring 1 in the embodiment 1 when the metal is liquefied.

TABLE 3

| | Density at room temperature (g/cm³) | Density of liquefied metal (g/cm³) | Reference: melting point (° C.) |
|---|---|---|---|
| Aluminum | 2.69 | 2.5(800° C.) | 660.4 |
| Copper | 8.93 | 7.8(1200° C.) | 1084.5 |
| Iron | 7.86 | 7.1(1550° C.) | 1535 |

It can be understood from Table 3 that the density of each of the metals is smaller after liquefied than before liquefied. This matter demonstrates that the volume of each of the metals after it is liquefied increases from that of the metal before it is liquefied. As shown in Table 3, the volume expansion coefficients of the metals based on liquefaction are as follows: the volume expansion coefficient of Al is 8% (2.69/2.5=1.08); that of copper is 14% (8.93/7.8=1.14); and that of iron is 11% (7.86/7.1=1.11). It can be therefore understood that the volume expansion coefficient of copper is the highest among aluminum, copper and iron.

Figure 21:
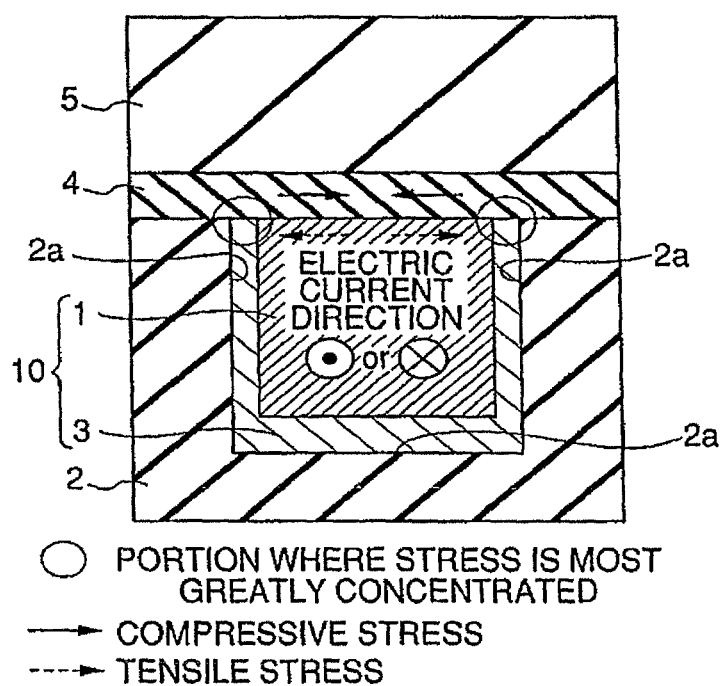
FIG. 21 is a view for explaining the direction of force acting on the electric fuse which is the basic example of the embodiment when an electric current flows into this electric fuse.
Figure 22:
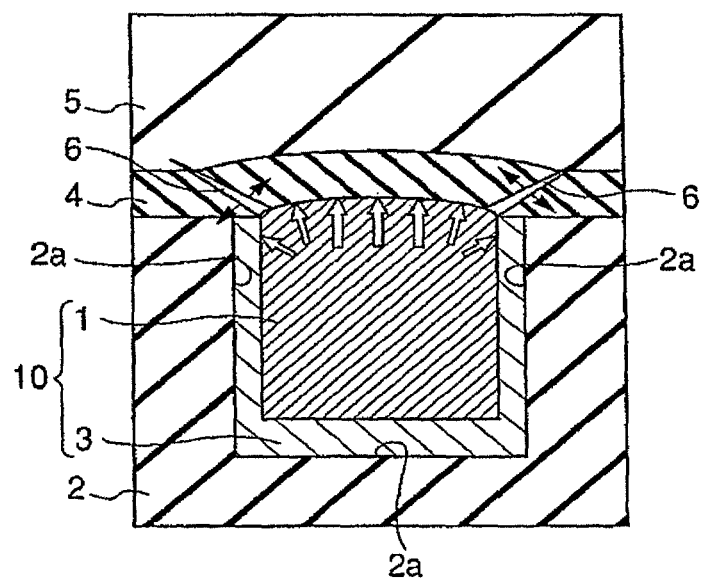
FIG. 22 is a view for explaining a state that the electric fuse of the basic example swells.
Figure 23:
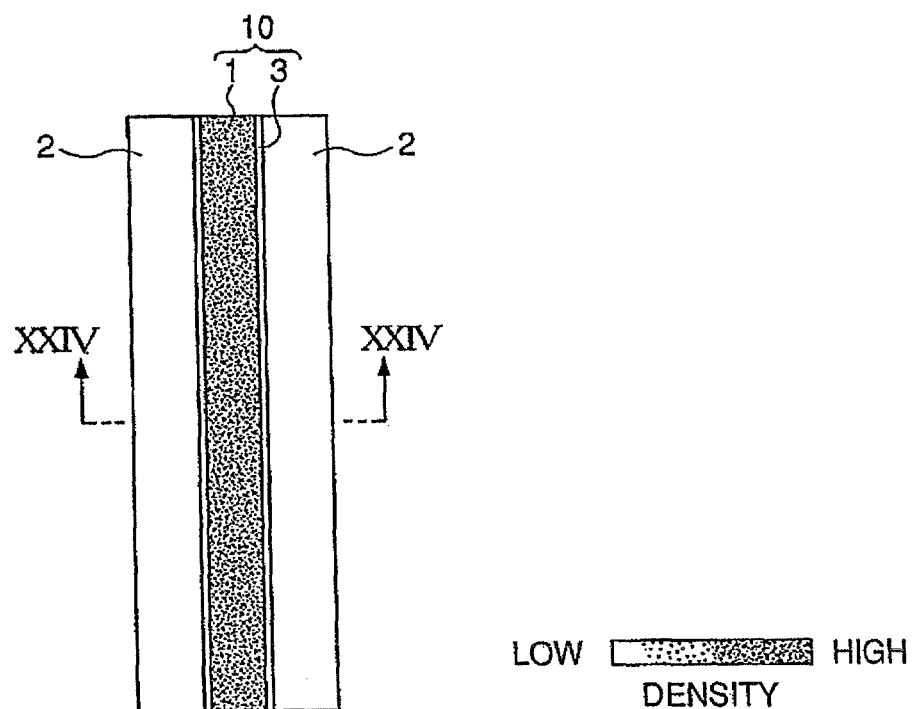
FIG. 23 is a top view illustrating a first state of the electric fuse of the basic example when it is cut.
Figure 24:
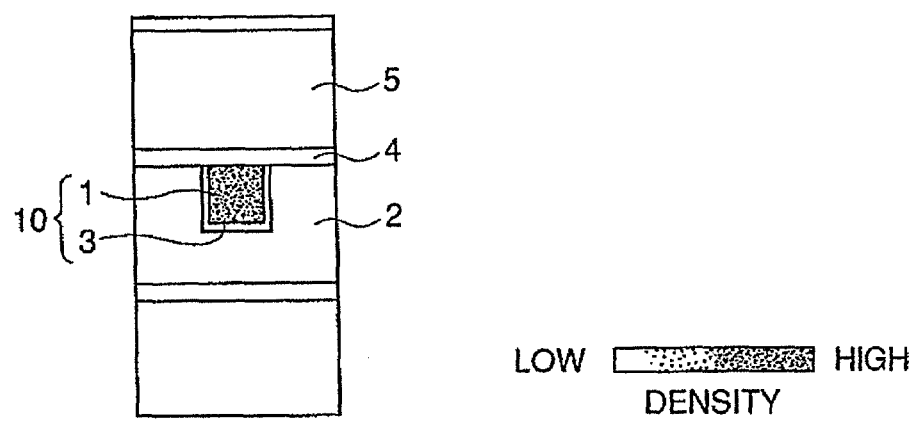
FIG. 24 is a sectional view taken on line XXIV-XXIV in FIG. 23.
Figure 25:
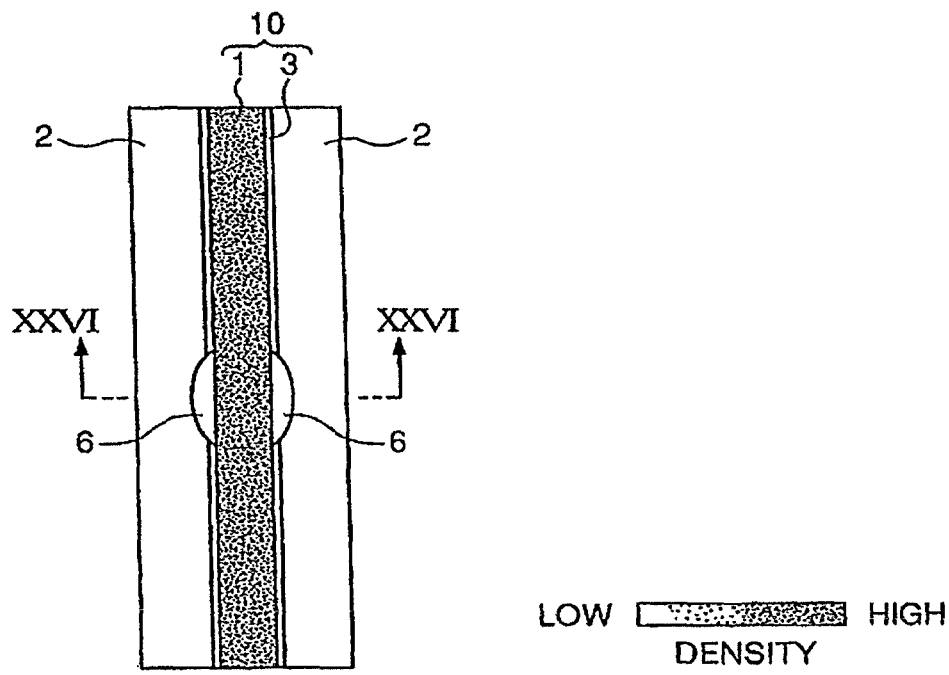
FIG. 25 is a top view illustrating a second state of the electric fuse of the basic example when it is cut.
Figure 26:
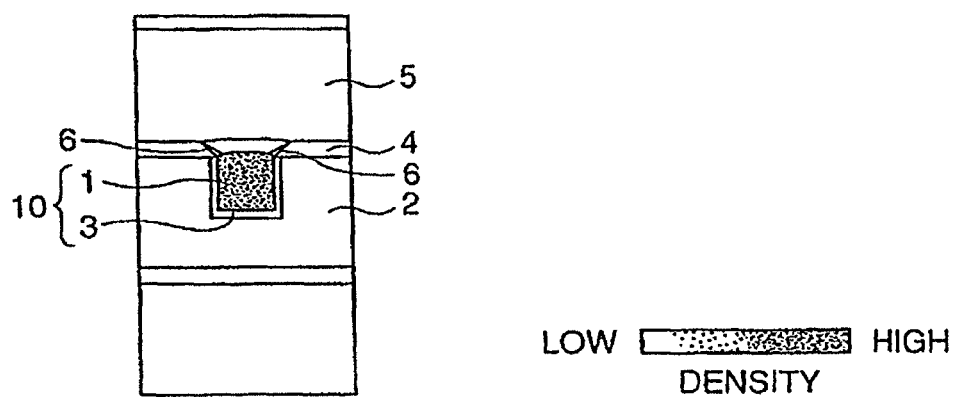
FIG. 26 is a sectional view taken on line XXVI-XXVI in FIG. 25.
Figure 27:
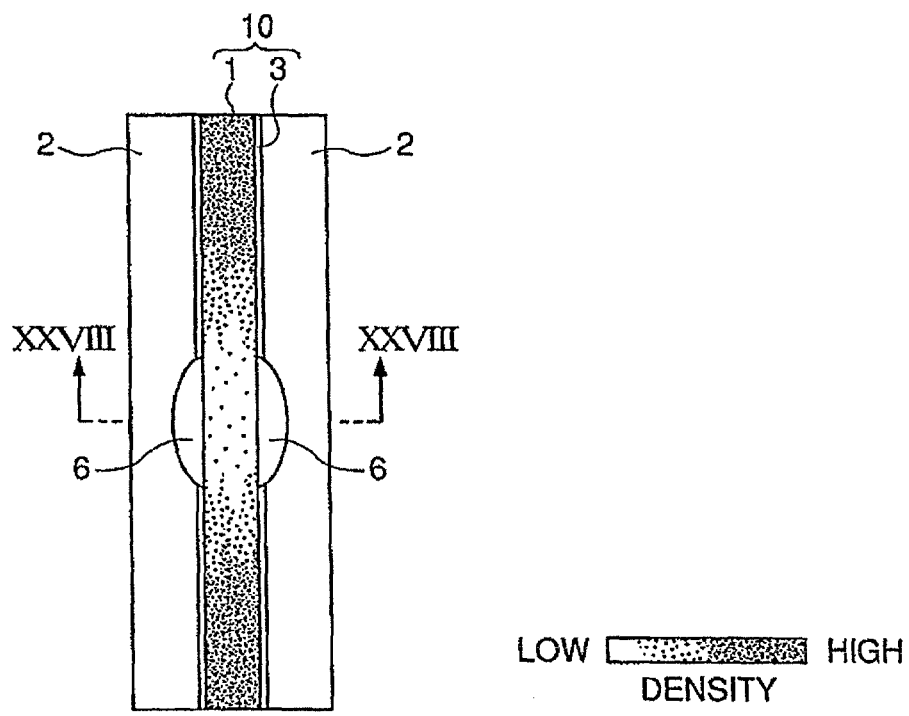
FIG. 27 is a top view illustrating a third state of the electric fuse of the basic example when it is cut.
Figure 28:
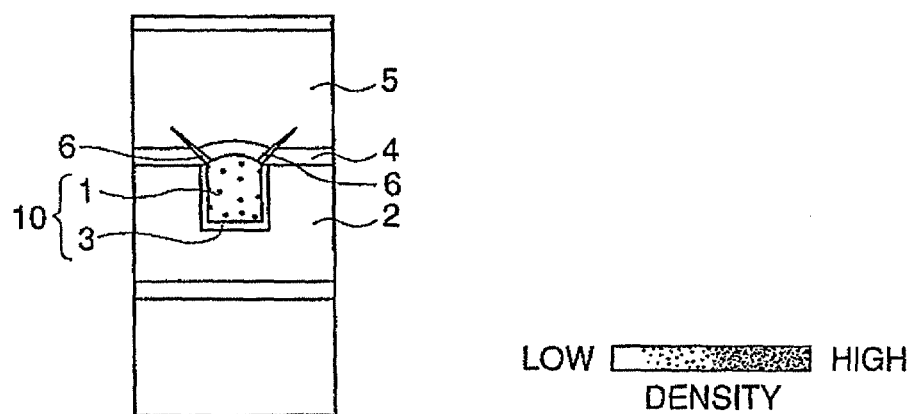
FIG. 28 is a sectional view taken on line XXVIII-XXVIII in FIG. 27.
Figure 29:
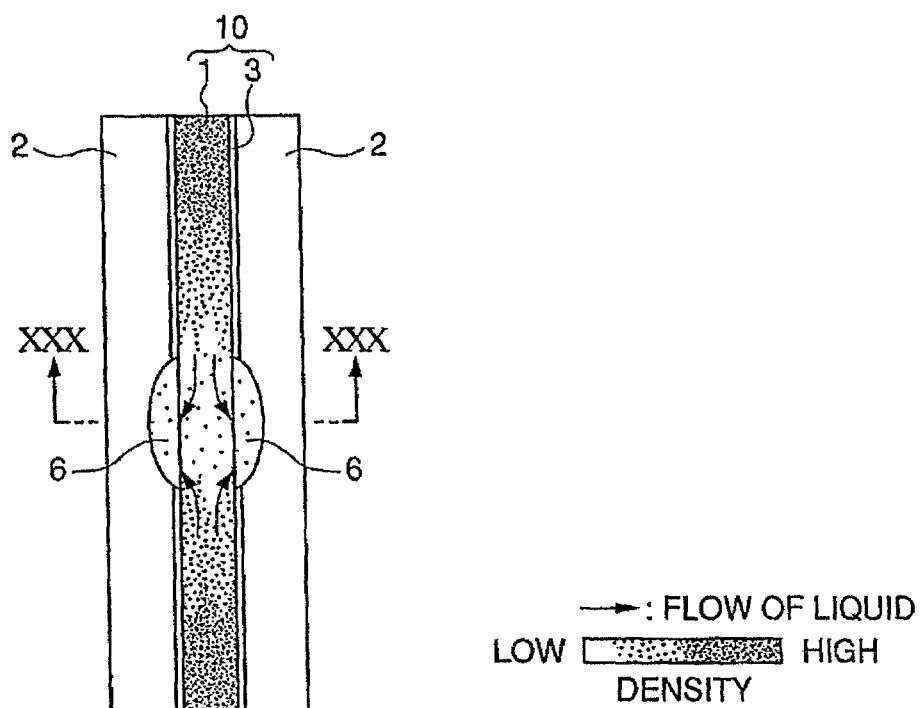
FIG. 29 is a top view illustrating a fourth state of the electric fuse of the basic example when it is cut.
Figure 30:
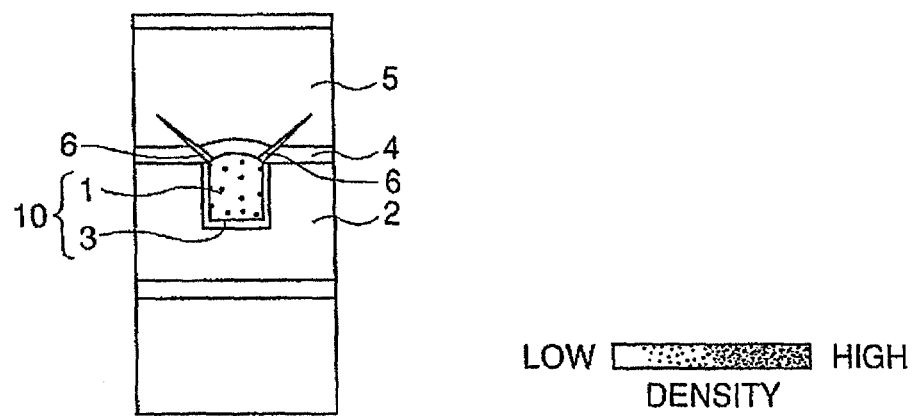
FIG. 30 is a sectional view taken on line XXX-XXX in FIG. 29.

With reference FIGS. 21 and 22, the effect generated when the resistance of the electric fuse 10 increases, in particular, the effect generated when the electric fuse 10 is cut is described, considering the above-mentioned matters.

In an electric fuse 10 illustrated in FIG. 21, an electric current flows along a direction perpendicular to the paper surface, that is, along a direction in which a main wiring 1 extends, whereby Joule heat is generated in the main wiring 1. Thus, the temperature of the main wiring 1 begins to rise. As a result, thermal stress is generated in each of the main wiring 1, a barrier film 3 and insulator layers 2, 4 and 5 on the basis of a difference between linear expansion coefficients thereof.

In the electric fuse structure of the embodiment 1, the linear expansion coefficient of the insulator layer 4 is considerably lower than that of the main wiring 1. For this reason, the degree of the expansion of the insulator layer 4 is smaller than that of the main wiring 1. The insulator layer 4 is brought into contact with the main wiring 1. Accordingly, even if the main wiring 1 is to expand, the insulator layer 4 restrains the expansion. As a result, tensile force is generated in the upper portion of the main wiring 1 and compressive force is generated in the lower portion of the insulator layer 4, as illustrated in FIG. 21, so that stress concentration is generated in encircled portions illustrated in FIG. 21.

When the temperature of the main wiring 1 further rises, the metal constituting the main wiring 1 changes from the solid to a liquid. In short, the metal undergoes phase change. In this way, the volume of the main wiring 1 further increases. At this time, the expansion of the main wiring 1 is limited by the barrier film 3. For this reason, the main wiring 1 expands only upwards, as represented by white arrows each surrounded by a black line in FIG. 22, whereby the insulator layer 4 is pushed upwards.

On the basis of a synergistic effect of the matter that stress concentration is generated at both ends of the upper portion of the main wiring 1 before the main wiring 1 is liquefied and that the insulator layer 4 is pushed upwards, cracks 6 are generated in the insulator layers 4 and 5 from the points where the stress concentration is generated, the points functioning as starting points.

By the generation of the cracks 6, a cavity is generated in the insulator layer 4. The width of the cavity is very small. The main wiring 1 is liquefied, and thus the liquefied main wiring 1 is absorbed into the cracks 6 by a capillary phenomenon. As a result, in the main wiring 1, discontinuous portions are formed at positions different from the positions where the cracks 6 are generated.

In FIGS. 23 to 32, a series of states that the cutting of the electric fuse 10 progresses as described above are illustrated in succession with time. As the number of one out of these figures is larger than others, the state illustrated in the figure is a state which makes its appearance later. FIGS. 23, 25, 27, 29 and 31 are each a top view, and FIGS. 24, 26, 28, 30 and 32 are each a sectional view.

Figure 31:
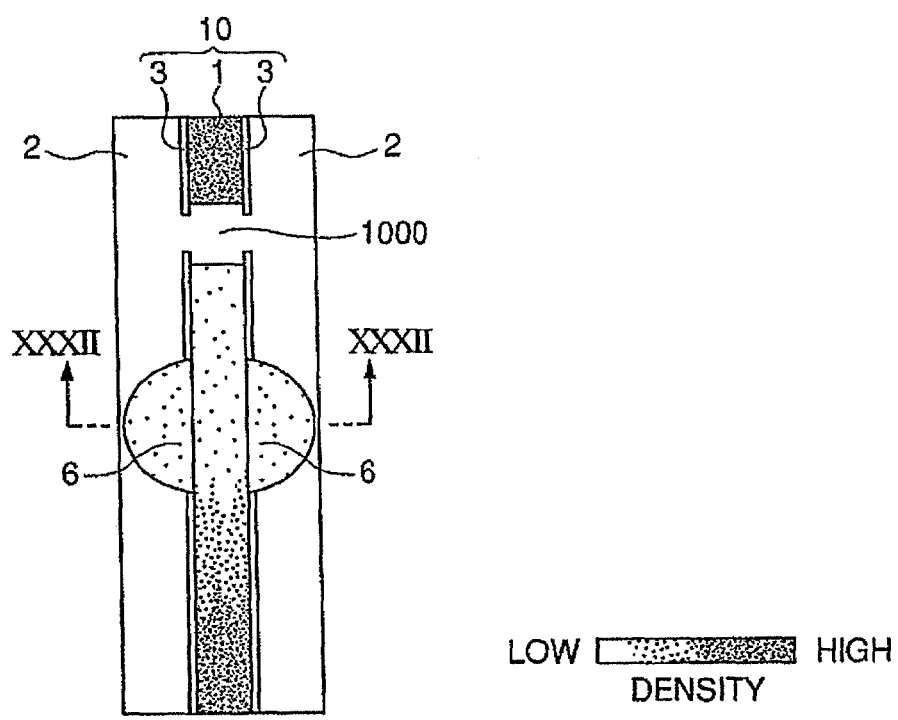
FIG. 31 is a top view illustrating a fifth state of the electric fuse of the basic example when it is cut.
Figure 32:
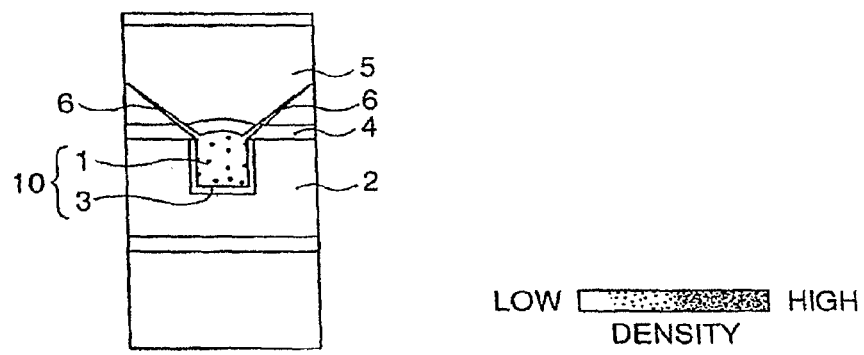
FIG. 32 is a sectional view taken on line XXXII-XXXII in FIG. 31.
Figure 33:
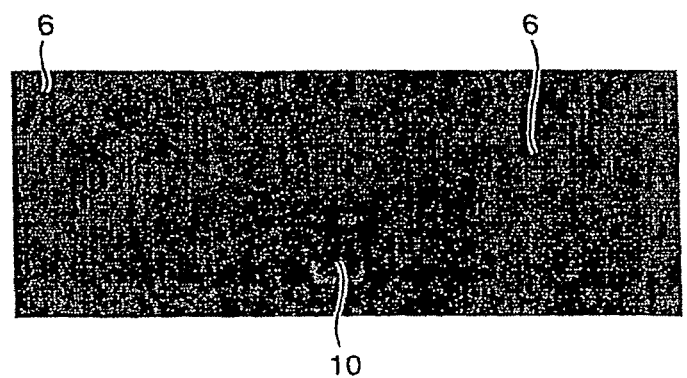
FIG. 33 is a photograph (of a cross section) showing a state that an electric fuse is absorbed into a crack formed in an insulator layer in an electric fuse structure.
Figure 34:
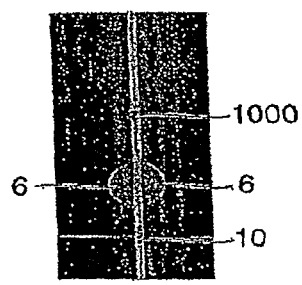
FIG. 34 is a photograph (of a top face) showing the state that the electric fuse is absorbed into the crack formed in the insulator layer in the electric fuse structure.

As illustrated in FIGS. 31 and 32, when a predetermined amount of the liquefied main wiring 1 is absorbed into the cracks 6 by a capillary phenomenon, the main wiring 1 and the barrier film 3 are cut. The barrier film 3 is cut by force generated when the main wiring 1 is absorbed. Even if residues of the barrier film 3 slightly remain at this time, the barrier film 3 can be cut without failure by causing a very small electric current to flow into the main wiring 1 continuously. In FIGS. 33 and 34, the electric fuse 10 having an actual cut portion 1000 is illustrated.

When the electric fuse 10 is cut by use of a capillary phenomenon as described above, no crack is generated in the insulator layer 2 below the main wiring 1. Moreover, when the electric fuse 10 is heated to a temperature that is slightly higher than the melting point of the main wiring 1, the electric fuse 10 can be cut. It is therefore possible to prevent a thermally adverse effect from being produced on surrounds of the electric fuse 10 and prevent elements, such as a transistor, from damaging the formed semiconductor substrate SC.

Embodiment 2

Figure 35:
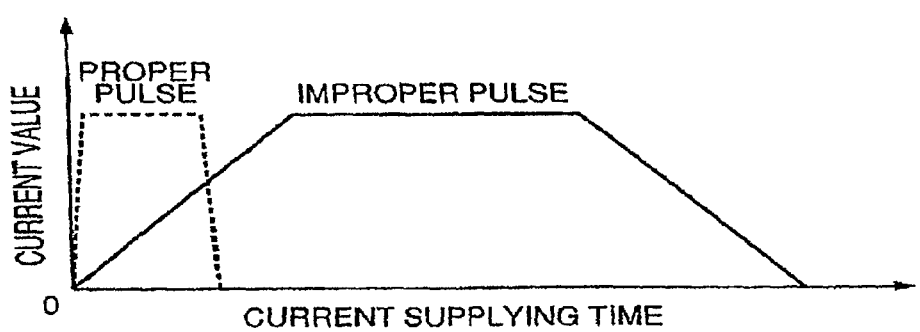
FIG. 35 is a view illustrating an electric current pulse as an improper pulse, and an electric current pulse as a proper pulse.
Figure 44:
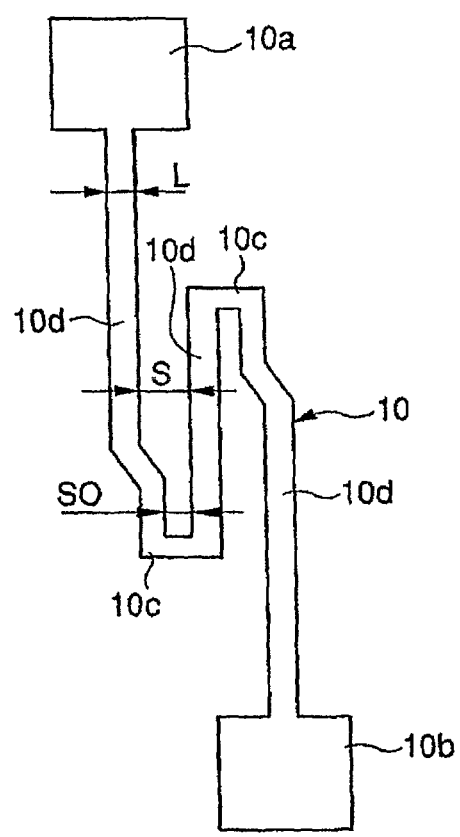
FIG. 44 is a view illustrating an electric fuse structure having a construction for preventing linear portions from short-circuiting.

With reference to FIGS. 35 and 44, a method of an embodiment 2, wherein the resistance of an electric fuse is increased, is described herein. The electric fuse structure used in the embodiment 2 may be the same as in the embodiment 1.

In the embodiment 2, a method for cutting the electric fuse 10 described in the embodiment 1 more certainly is described. Specifically, described is a matter that it is necessary to adjust the rise time of electric pulses caused to flow into the electric fuse 10 in order to cut the electric fuse 10 more certainly.

When the electric fuse is cut, the temperature of the main wiring 1 needs to reach the melting point or a higher temperature. However, a phenomenon generated when the electric fuse 10 is cut is varied in accordance with the period from a time when a rise in the temperature of the main wiring 1 starts to a time when the temperature of the main wiring 1 reaches the melting point or a higher temperature. Accordingly, unless this period is adjusted, it is impossible to cut the electric fuse without damaging surrounds of the electric fuse 10.

FIG. 35 shows two kinds of electric current pulses which have the same values of currents flowing into the electric fuse 10 but have different rise times and falls times. As illustrated in FIG. 35, the electric current pulse shown as a proper pulse has a far shorter fall time (i.e., a period from a time when the supply of an electric current is started to a time when the supply of an electric current having a constant value starts) than the electric current pulse shown as an improper pulse.

Figure 36:
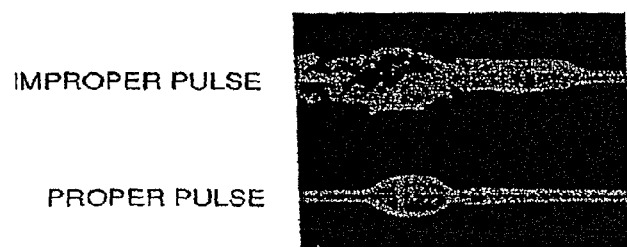
FIG. 36 is a photograph showing an electric fuse cut by an electric current pulse as an improper pulse, and an electric fuse cut by an electric current pulse as a proper pulse.

FIG. 36 shows a state of the electric fuse 10 which is cut by receiving the supply of electric current pulses as improper pulses as illustrated in FIG. 35, and a state of the electric fuse 10 which is cut by receiving the supply of electric current pulses as proper pulses as illustrated in FIG. 35.

As described above, the method of increasing the resistance of the electric fuse 10 in the embodiment 1, in particular, the method of cutting the electric fuse 10 is a method of generating the cracks in the insulator layer 4 to cause the liquefied main wiring 1 to be absorbed into the cracks 6, thereby cutting the main wiring 1. However, if the insulator layer 4 is softened by Joule heat from the main wiring 1, the cracks 6 are not generated in the insulator layer 4; therefore, the electric fuse 10 may not be cut in a short time. If in this case an electric current is caused to flow into the electric fuse 10 for a long time so that heat is continuously generated from the electric fuse 10 over a long time, the surrounding structure of the electric fuse 10 may be damaged.

Thus, the shape of electric current pulses for generating the cracks 6 in the insulator layer 4 to cut the electric fuse 10 in a short time will be discussed hereinafter.

First, considered is a rise in the temperature of a metallic cube having the same volume as the electric fuse 10 when the cube is uniformly heated in an adiabatic state. The reason why this matter is considered is as follows: it can be estimated that the electric fuse 10 is present in a state equivalent to an adiabatic state since the fuse 10 is surrounded by the insulator layers 2 and 4.

Calculation Conditions
wiring width: 0.1 μm, wiring thickness: 0.2 μm, wiring length: 8 μm,
wiring volume: 0.16 μm³, and
applied current: 15 mA, and 30 mA.

Herein, a case is considered where electric current pulses which have a current value of 15 mA and 30 mA, respectively, and each have a rise time of 0 μs are each supplied to the metallic cube. The electric pulses are theoretical pulses. The time required until each of the metals is liquefied in this case is shown in Table 4.

The melting point arrival time of each of the metals shown in Table 4 is the shortest time ts necessary until the cube of the metal is liquefied. When the value of the current supplied to the cube of Cu is, for example, 15 mA, the shortest time ts, which is necessary until the cube is liquefied, is about 0.5 μs. When the value of the current supplied to the cube of Cu is 30 mA, the shortest time ts is about 0.1 μs.

Since the shortest time ts is a time necessary until the cube of a metal reaches the melting point thereof, the time ts does not precisely represent a time required for a rise in the temperature of the electric fuse 10, which is a long and thin line. Since the electric current pulses given to the cube are theoretical pulses which do not have any rise time (rise time=0 μs), the pulses are different from electric current pulses having a rise time.

Figure 37:
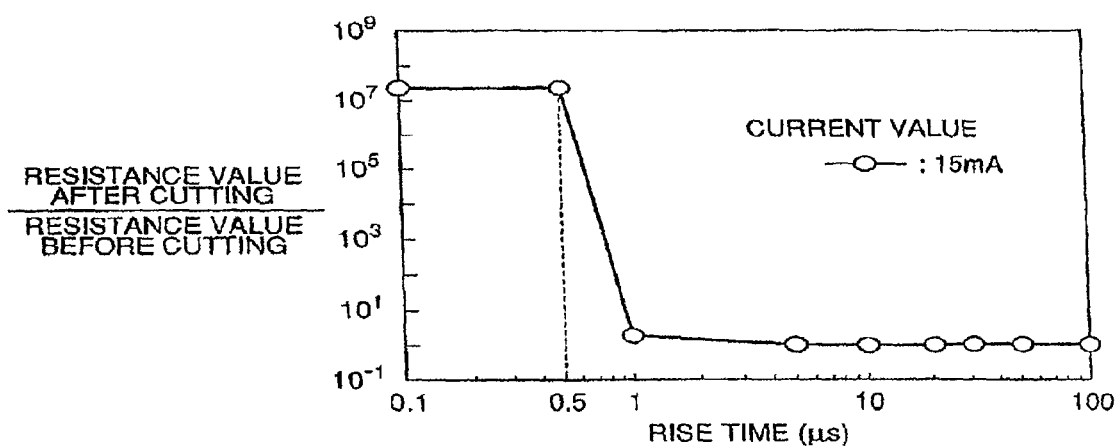
FIG. 37 is a graph showing a relationship between rise time of electric current pulses and the ratio of the resistance of an electric fuse after the fuse is cut to that of the electric fuse before the fuse is cut.

FIG. 37 shows a relationship between the rise time of electric pulses (2 μs) and the ratio of the resistance of the electric fuse 10 after the fuse 10 is cut to that of the electric fuse 10 before the fuse 10 is cut. As can be understood from FIG. 37, when the current value of the electric current pulses is 15 mA and the rise time thereof is 0.5 μs, the electric fuse 10 is cut. However, when the current value of the electric current pulses is 15 mA but the rise time thereof is over 0.5 μs, the resistance of the electric fuse 10 hardly increases. FIG. 37 shows results from an experiment wherein electric current pulses were given to the actual electric fuse 10.

From the comparison of the experimental results shown in FIG. 37 with the values estimated theoretically from the use of the values shown in Table 4, it is understood that the above-mentioned shortest time ts can be adopted as an index for deciding the rise time of actual pulses supplied to the electric fuse 10 which is long and thin and is actually used. In other words, it can be considered that when the rise time of electric current pulses given to the actual electric fuse 10 is shorter than the theoretically-estimated shortest time ts, the electric fuse 10 can be properly cut.

When it is assumed that the rise time, a time when a constant electric current is caused to flow, and the fall time are equal to each other (tm) under consideration of the above-mentioned matters, the cut time of the electric fuse 10 can be represented by the following expression:

TABLE 4

| Material | Specific heat (kJ/(kgK)) | Melting point (° C.) | Heat of melting (kJ/kg) | Boiling point (° C.) | Evaporation heat (kJ/kg) | Electric current (mA) | Volume resistivity (×10⁻⁸ Ωm) | Wiring film thickness (μm) | Wiring width (μm) | Wiring length (μm) | Density (kg/m³) | Melting point arrival time (μs) |
|---|---|---|---|---|---|---|---|---|---|---|---|---|
| Al | 1 | 660.4 | 311.3 | 2486 | 10888.9 | 15 | 2.7 | 0.2 | 0.1 | 8 | 2690 | 0.113 |
| Cu | 0.47 | 1084.5 | 213 | 2580 | 4789 | 15 | 1.6 | 0.2 | 0.1 | 8 | 8500 | 0.470 |
| Al | 1 | 660.4 | 311.3 | 2486 | 10888.9 | 30 | 2.7 | 0.2 | 0.1 | 8 | 2690 | 0.028 |
| Cu | 0.47 | 1084.5 | 213 | 2580 | 4789 | 30 | 1.6 | 0.2 | 0.1 | 8 | 8500 | 0.118 |

Cut time=[rise time]+[time when a constant electric current is caused to flow]+[fall time]=3×[shortest time (ts)]

It can be understood from this expression that when an electric current of 15 mA is caused to flow into the electric fuse 10, the electric fuse 10 can be cut in a time of 1.5 µs or less.

When the rise time is actually shorter, the following can be admitted even if the width and the thickness of the main wiring 1 are scattered: the adjustment of the time when the constant electric current is caused to flow makes it possible to cut the electric fuse 10 in a time of less than 1 µs.

According to the electric fuse cutting method of the embodiment 2, the electric fuse 10 can be cut in a time of about several microseconds. Specifically, according to the electric fuse cutting method of the embodiment 2, the electric fuse 10 can be cut in a very short time which is 1/133 (=1.5 µs/200 µs) of the time required for cutting an electric fuse in the above-mentioned conventional electric fuse cutting method.

Figure 38:
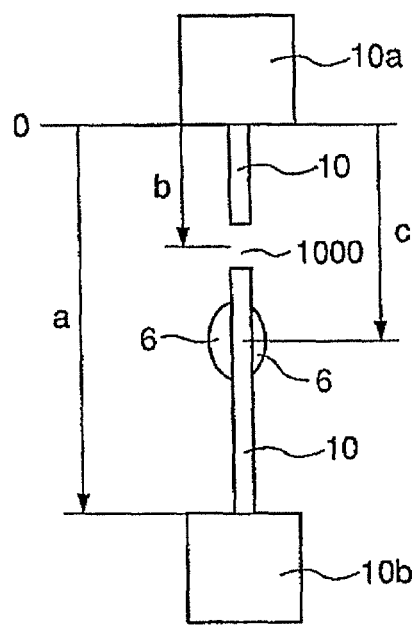
FIG. 38 is a top view illustrating an example of the position of a cut portion of an electric fuse made only of a linear portion.
Figure 39:
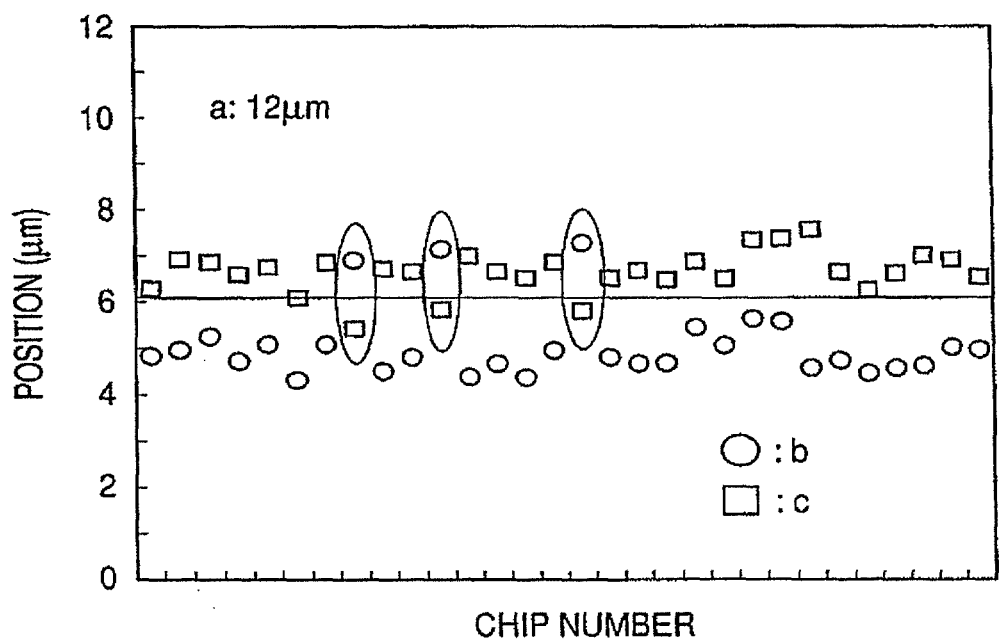
FIG. 39 is a chart wherein positions of cut portions of plural electric fuses each made only of a linear portion are plotted.

However, when the electric fuse 10 illustrated in FIGS. 5 and 6, which has only a linear shape, is cut by the above-mentioned method, either one of sites at both sides of the site where the capillary phenomenon is generated is cut. However, the position of the cut portion 1000 cannot be specified. FIGS. 38 and 39 show examples of positions of a crack 6 generated when an electric fuse 10 made only of a linear shape is cut and examples of the position of a cut portion 1000.

It is theoretically known that when the length of the electric fuse 10 is 12 µm, the crack 6 is generated at a position 6.6 µm apart from one of ends of the electric fuse 10 and the cut portion 1000 is formed at a position 5.1 µm apart from the end.

It is also understood from FIG. 39 that most of the examples of the position of the cut portion 1000 are positioned upstream from the examples of the position of the crack 6 but about measurement results each surrounded by an ellipse, which are different from the other measurement results, the examples of the position of the cut portion 1000 are positioned downstream from the examples of the position of the crack 6. It appears that this tendency is produced regardless of the length of the electric fuse 10. As described herein, when the electric fuse 10 made only of a linear shape is used, there arises a problem that the position of the cut portion 1000 is not easily specified.

One method for solving this problem is a method of generating cracks 6 at two sites, and causing the melted main wiring 1 to be absorbed into each of the two sites, thereby cutting the electric fuse 10 at a position between the two sites. For this method, it is effective to use the electric fuse 10 having a meandering shape as illustrated in FIGS. 3 and 4, that is, the electric fuse 10 having bent portions 10c and linear portions 10d.

Figure 40:
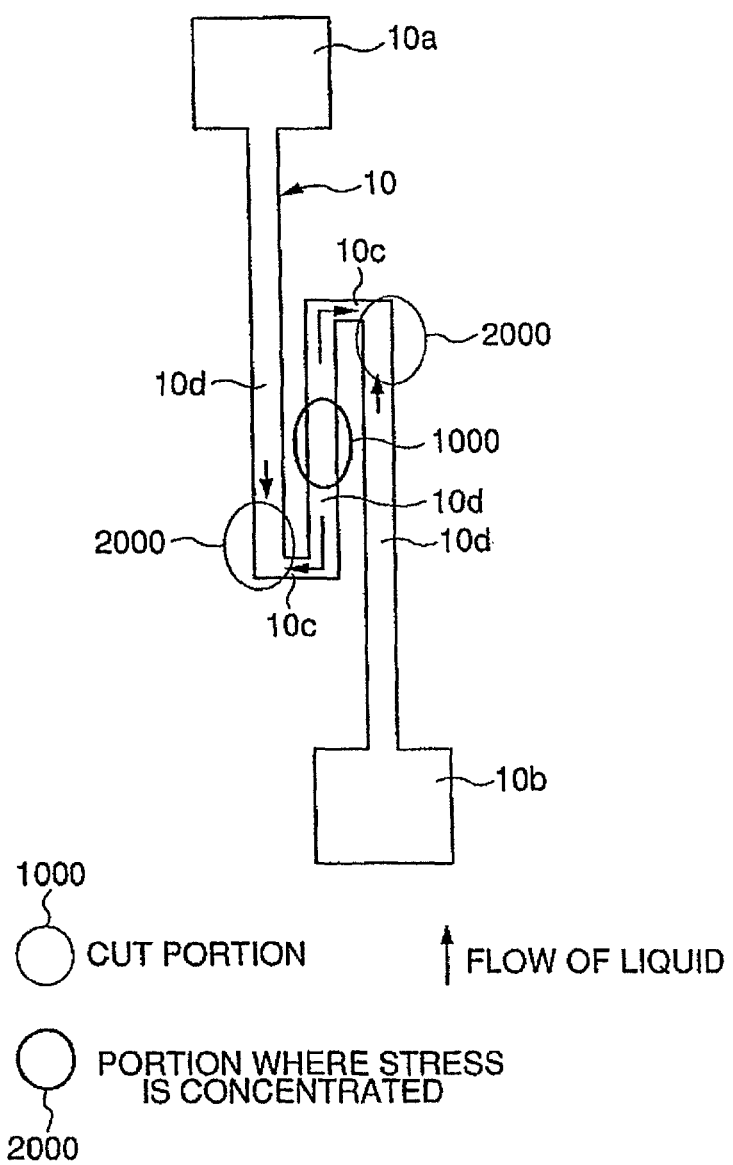
FIG. 40 is a view for explaining an electric fuse structure wherein a central portion is selectively to be cut.
Figure 41:
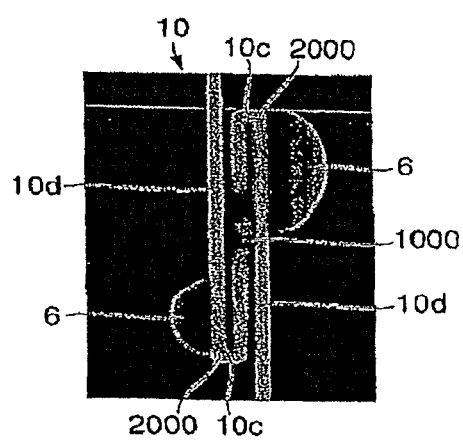
FIG. 41 is a photograph showing an electric fuse structure wherein a central portion was selectively cut.

According to such an electric fuse, which has a meandering shape, such as an electric fuse 10 illustrated in FIGS. 40 and 41, stress concentration can be generated at positions 2000 which are each near one of bent portions 10c of the electric fuse 10. For this reason, the position of a cut portion 1000 can be specified. In other words, the cut portion 1000 can be formed at a position between the two bent portions 10c.

Figure 42:
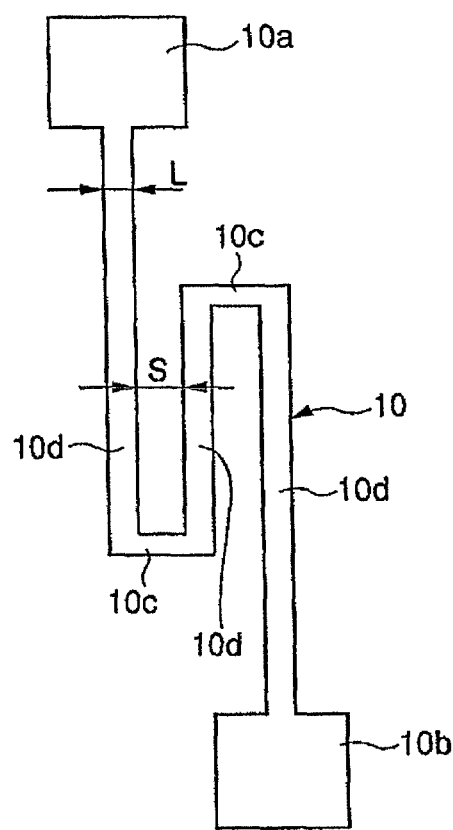
FIG. 42 is a view illustrating the distance between linear portions.
Figure 43:
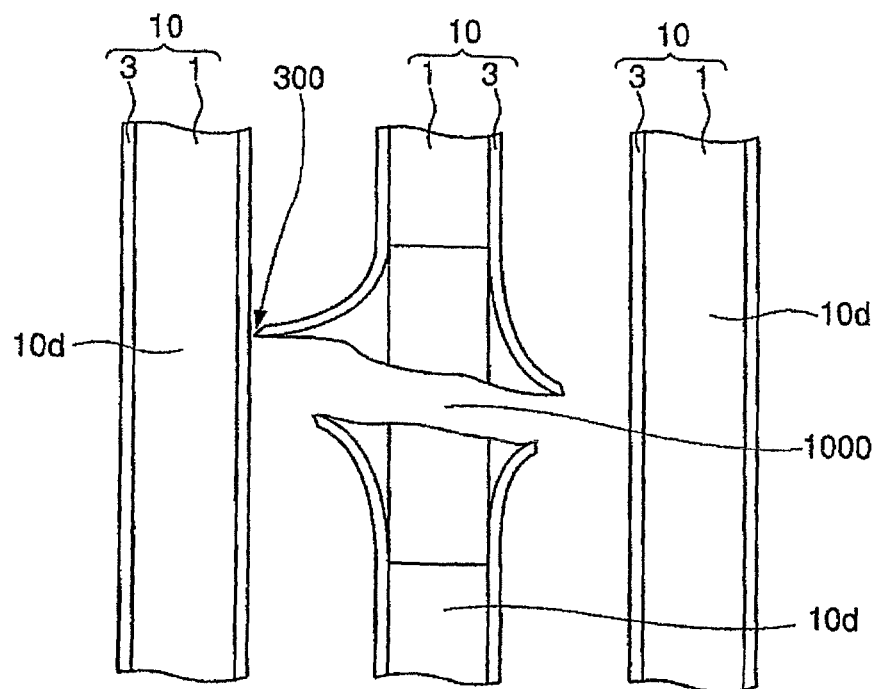
FIG. 43 is a view illustrating a state that linear portions short-circuit through a cut piece.

However, when the distance S between linear portions 10d illustrated in FIG. 42 is small, cut pieces are scattered so that the cut linear portions 10d of the electric fuse 10 may short-circuit, as illustrated in FIG. 43.

It is known, from consideration of diffusion of the cut portion 1000 to the outside of a barrier film 3, whether or not the cut linear portions 10d of the electric fuse 10 short-circuit depends basically on the size of the cut portion 1000.

The size of the cut portion 1000 is about less than 0.3 µm; therefore, it is desired that the distance S between the linear portions 10d of the electric fuse 10, which has the meandering shape, is 0.3 µm or more. In short, it is desired that the distance S between the linear portions 10d near the cut portion 1000 is larger than the size of the cut portion 1000. As illustrated in FIG. 44, the distance S between linear portions 10d is 0.3 µm or more; in order to generate stress concentration easily, the distance S0 between line moieties near each bent portion 10c is desirably smaller than the distance S between the linear portions 10d.

Embodiment 3

Figure 45:
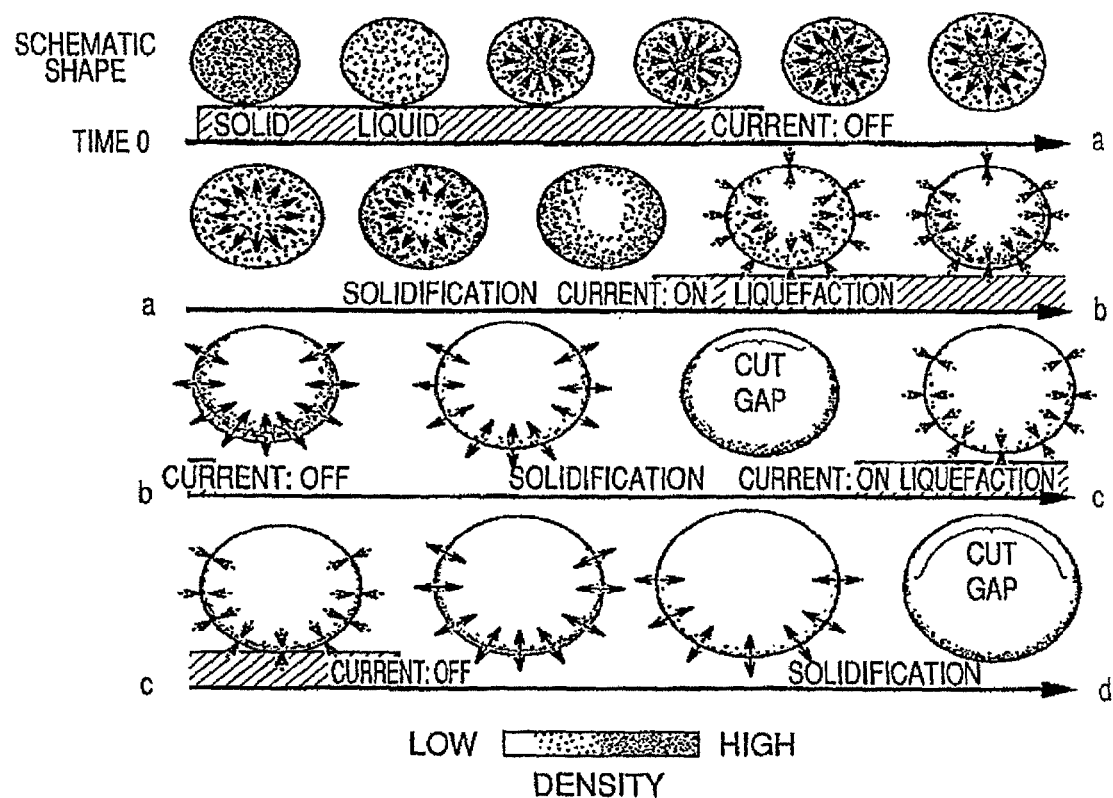
FIG. 45 is a view for explaining a method of cutting an electric fuse by use of pinch effect.
Figure 46:
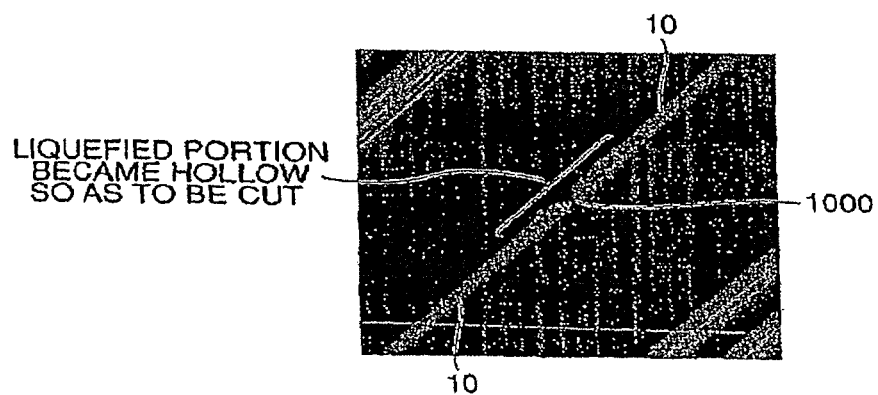
FIG. 46 is a photograph showing an electric fuse cut by pinch effect.
Figure 47:
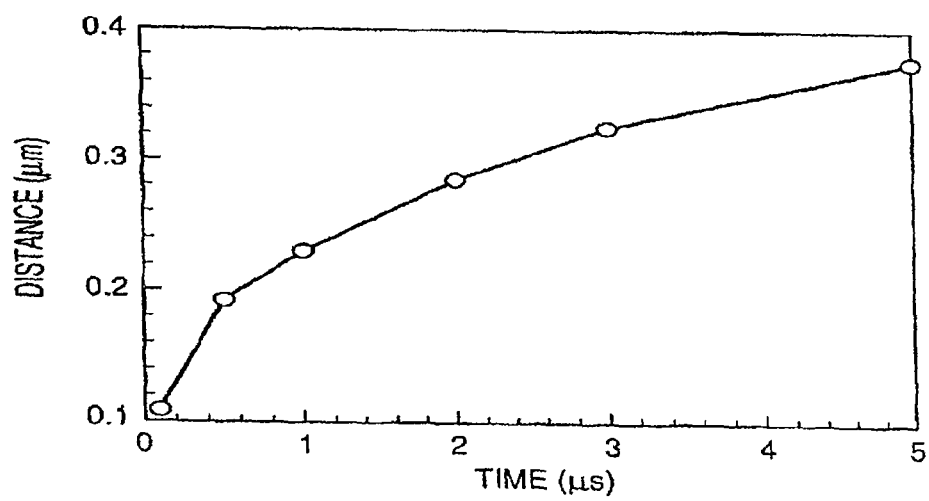
FIG. 47 is a graph of a relationship between time and the distance between a moiety having a temperature of 600° C. when the temperature of an electric fuse was kept at 1200° C. and the electric fuse.

With reference to FIGS. 45 to 47, a method of an embodiment 3, wherein the resistance of an electric fuse is increased, is described herein. The electric fuse structure in the embodiment 3 may be the same as in the embodiment 1.

In the case of using the method of increasing the resistance of an electric fuse according to each of the embodiments 1 and 2, the cracks 6 may not extend immediately in the insulator layer 4. This would be because a considerable large electric current cannot be caused to flow into the electric fuse 10 because of a problem resulting from the structure of the circuit and thus thermal stress generated in the electric fuse structure is not sufficiently large for generating the cracks 6. For this reason, the electric fuse 10 may not be cut by the cutting method described as the embodiment 1 or 2. Accordingly, a method for cutting the electric fuse 10 certainly in this case will be described hereinafter.

When an electric current is caused to flow into the electric fuse 10, the main wiring 1 changes from solid to liquid as the temperature of the electric fuse 10 rises. When no crack is generated in the insulator layer 4, an electric current flows into the main wiring 1 in the liquid state. When an electric current of $10^8$ A/m$^2$ or more is caused to flow into the main wiring 1 in this case, electromagnetic force is generated toward the central of the main wiring 1. This is called pinch effect. As a result, a liquefied portion in the main wiring 1 will be shrunken by surface tension and the pinch effect. This pinch effect will be described in detail hereinafter.

For simplicity of the description, it is presumed that the main wiring 1 has a columnar shape. When an electric current flows into the main wiring 1, a magnetic field is formed so that Lorentz force F is generated in a direction perpendicular to the direction along which the electric current flows. At this time, the magnetic field B is represented by the following equation (1):

$$B = \frac{\mu 0 \times \int i \cdot ds}{2\pi r}$$

When the radius of the above-mentioned column is represented by r (m), the magnetic field B (Nm) and the density j (A/m$^2$) of the current are used to represent the Lorentz force F (N/m$^3$) generated in each unit volume of the main wiring 1 by the following equation (2):

$$F = j \cdot \frac{\mu 0 \times \int i \cdot ds}{2\pi R}$$
$$= \mu 0 \cdot \frac{I}{\pi R^2} \cdot \frac{I}{2\pi R}$$

In the equation (1), it is presumed that the current density j is uniform. In the formula (1), µ0 is the magnetic permeability, S is any closed surface, I is the value of the current given to the main wiring 1, and R is the distance from the portion which constitutes the main wiring 1 to the center of the column. When the density of the material which constitutes the main wiring 1 is represented by ρ (kg/m³), the acceleration a generated in each unit volume of the main wiring 1 by the Lorentz force F is equal to F/ρ (m/s²).

Accordingly, using the acceleration a, the time t (s) when the distance becomes zero, that is, the time when the electric fuse 10 becomes theoretically narrowest is represented by $t=\sqrt{(2r/a)}$.

When it is presumed that the radius r of the main wiring 1 is 0.075 μm, the applied current is 15 mA, the density ρ is 8780 kg/m³, and the magnetic permeability μ0 is 1.256637×10⁻⁶ (H/m), the Lorentz force F, the acceleration a, and the time t are calculated as follows:

$$F=3.3953\times10^{10} \text{ N/m}^3,$$

$$a=3.8671\times10^6 \text{ m/s}^2, \text{ and}$$

$$t=197 \text{ ns}.$$

It can be considered from the above-mentioned matter that when pinch effect is used, the time (t) necessary for making the main wiring 1 narrowest becomes very short. In other words, it is expected that even if the width of given electric current pulses is small, the diameter of the electric fuse 10 becomes very small by pinch effect. The current density j is 8.49×10¹¹ A/m².

In order to use pinch effect to cut the electric fuse 10, the supply of the electric current (pulses) to the electric fuse 10 is stopped when the liquefied portion of the electric fuse 10 becomes narrowest, that is, the time t when the above-mentioned R becomes zero. From this time, the solidification of the main wiring 1 starts. When the supply of the electric current (pulses) to the electric fuse 10 is stopped, retaining force acts in a direction opposite to the direction along which the electric fuse 10 is shrunken. As a result, the electric fuse 10 starts to swell.

When electric current pulses are again supplied to the main wiring 1, a phenomenon that the above-mentioned shrinking force and retaining force are alternately generated is repeated, so that the diameter of the moiety onto which the Lorentz force L of the main wiring 1 acts becomes smaller. Accordingly, at last, the liquefied portion of the main wiring 1 is cut. FIG. 45 illustrates steps of repeating switching-on and switching-off of electric current pulses so as to form a cut portion 1000 on the electric fuse 10.

In the method of cutting an electric fuse according to the embodiment 3, shrinking force (Lorentz force L) generated by switching-on of an electric current on the basis of pinch effect and force (retaining force) generated in a swelling direction by switching-off of the electric current act alternately and repeatedly onto the electric fuse 10. Since the main wiring 1 is liquefied at the position where the pinch effect is generated, surface tension is also generated together with the Lorentz force F. At this time, the insulator layers 2, 4 and 5 around the electric fuse 10 are softened by heat from the electric fuse 10. Thus, the electric fuse 10 swells outside. As a result, a central portion of the electric fuse 10 gradually becomes hollow. At last, the electric fuse 10 is cut. The liquefied electric fuse 10 is easily stayed at the lower side thereof by gravity. Thus, the cutting of the electric fuse 10 starts from the upper side thereof.

As described above, in the method of cutting an electric fuse according to the embodiment 3, a predetermined electric current pulse is repeatedly given to the electric fuse 10, whereby pinch effect is repeatedly generated. As a result, the electric fuse 10 is cut at its cut portion 1000, as illustrated in FIG. 46.

According to the method of cutting an electric fuse according to the embodiment 3 also, the time required until the main wiring 1 is liquefied and the time when an electric current (pulses) is caused to flow into the main wiring 1 are very short; therefore, thermal damage generated around the electric fuse 10 is restrained.

In the method of cutting an electric fuse according to the embodiment 3, for example, the temperature of the electric fuse 10 is kept at 1200° C. only for 5 μs. In this case, moieties where the temperature becomes 600° C. or higher in the insulator layers 2, 4 and 5 arranged around the electric fuse 10 are moieties wherein the distance from the electric fuse 10 is less than 0.4 μm. Accordingly, an adverse effect based on heat generated from the electric fuse 10 is hardly produced onto any element arranged around the electric fuse 10.

A theory and experimental results have demonstrated that when the electric fuse 10 is cut by pinch effect, a central portion of the fuse 10, which has equal distances from both ends of the fuse 10, is cut.

It should be understood that all the embodiments disclosed herein are illustrative and are not restrictive. The scope of the present invention is specified not by the above-mentioned description but by the appended claims. All modifications which have meanings equivalent to the claims or which are within the scope recited in the claims are intended to be included in the invention.

What is claimed is:

1. A semiconductor device, comprising: a semiconductor substrate;
   a transistor formed on a main surface of the semiconductor substrate; a first insulator layer formed over the transistor; a first trench formed in the first insulator layer;
   a first wiring comprised of a first metal and formed in the first trench,
   a second insulator layer formed over the first wiring;
   a second trench formed in the second insulator layer;
   a second wiring formed in the second trench,
   an electric fuse formed of the same layer as that of the first wiring;
   a third insulator layer formed over the second insulator layer;
   a third wiring formed over the third insulator layer, and
   a metal cap film formed to cover an entire upper surface of the first wiring, including an entire upper surface of the electric fuse, the metal cap film being comprised of a metal having a higher electric resistance than the first metal,
   wherein a first thickness of the first wiring and the electric fuse is thinner than a second thickness of the second wiring, and
   wherein a dielectric relative constant of each of the first insulator layer and the second insulator layer is 3 or less.

2. The semiconductor device according to the claim 1, wherein the electric fuse is configured so that, when the current exceeding a predetermined level is applied to the electric fuse, the electric fuse is cut.

3. The semiconductor device according to the claim 1, further comprising a fourth insulator film formed on the electric fuse, wherein an upper surface of the electric fuse is covered with the fourth insulator film.

4. The semiconductor device according to claim 1, wherein a third thickness of the third wiring is greater than either of the first thickness and the second thickness.

5. The semiconductor device according to claim 4, wherein a third width of the third wiring is greater than either of a first width of the first wiring and second width of the second wiring.

6. The semiconductor device according to claim 1, wherein the first metal comprises copper.

7. The semiconductor device according to claim 6, wherein the second wiring is comprised of copper.

8. The semiconductor device according to claim 6, wherein the metal cap film is comprised of aluminum.

9. The semiconductor device according to claim 7, wherein the metal cap film is comprised of aluminum.

* * * * *